(12) United States Patent
Ogita et al.

(10) Patent No.: US 7,436,344 B2
(45) Date of Patent: Oct. 14, 2008

(54) PIPELINE A/D CONVERTER

(75) Inventors: Shinichi Ogita, Yawata (JP); Mitsuhiko Otani, Amagasaki (JP); Kouji Yamaguchi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/781,976

(22) Filed: Jul. 24, 2007

(65) Prior Publication Data

US 2007/0296623 A1    Dec. 27, 2007

Related U.S. Application Data

(62) Division of application No. 11/140,344, filed on May 27, 2005, now Pat. No. 7,259,709.

(30) Foreign Application Priority Data

Jun. 14, 2004   (JP)   .............................. 2004-176011

(51) Int. Cl.
*H03M 1/12* (2006.01)
(52) U.S. Cl. ...................... 341/172; 341/120; 341/143; 341/155; 341/161; 341/162
(58) Field of Classification Search ................ 341/118, 341/120, 155, 161, 172, 162
See application file for complete search history.

(56) References Cited

U.S. PATENT DOCUMENTS

| | | | |
|---|---|---|---|
| 5,416,485 A | | 5/1995 | Lee |
| 5,574,457 A | * | 11/1996 | Garrity et al. ................ 341/172 |
| 5,594,445 A | * | 1/1997 | Ginetti ........................ 341/162 |
| 5,771,012 A | | 6/1998 | Shu et al. |
| 6,184,809 B1 | * | 2/2001 | Yu .............................. 341/120 |
| 6,249,240 B1 | | 6/2001 | Bellaouar |
| 6,340,944 B1 | | 1/2002 | Chang et al. |
| 6,362,770 B1 | | 3/2002 | Miller et al. |
| 6,366,230 B1 | * | 4/2002 | Zhang et al. ................. 341/162 |
| 6,400,214 B1 | | 6/2002 | Aram et al. |
| 6,501,400 B2 | | 12/2002 | Ali |

(Continued)

FOREIGN PATENT DOCUMENTS

JP    2003-198368 A    7/2003

OTHER PUBLICATIONS

Wenhau (Will) Yang, "A 3-V 340-mW 14-b 75-Msample/s CMOS ADC With 85-dB SFDR at Dyquist Input", IEEE Journal of Solid-State Circuits, vol. 36, No. 12, (2001).

(Continued)

*Primary Examiner*—Linh V Nguyen
(74) *Attorney, Agent, or Firm*—Panitch Schwarze Belisario & Nadel LLP

(57) ABSTRACT

The present invention provides a pipeline A/D converter having resolution, allowable conversion processing rate and power consumption satisfying the requests of a system incorporating the pipeline A/D converter. The pipeline A/D converter in accordance with the present invention comprises a control section for outputting a control signal according to the operation state of an apparatus incorporating the pipeline A/D converter, and a pipeline A/D conversion section, the resolution and/or allowable conversion processing rate of which are switched by switching the capacitance in a built-in operational amplifier according to the control signal.

4 Claims, 14 Drawing Sheets

U.S. PATENT DOCUMENTS

| | | | |
|---|---|---|---|
| 6,577,185 B1 | 6/2003 | Chandler et al. | |
| 6,580,383 B1 | 6/2003 | Devendorf et al. | |
| 6,686,957 B1 | 2/2004 | Johnson et al. | |
| 6,724,338 B1 | 4/2004 | Min et al. | |
| 6,778,126 B2 * | 8/2004 | Ali | 341/156 |
| 6,788,126 B2 | 9/2004 | Stave | |
| 6,956,519 B1 * | 10/2005 | Huang et al. | 341/172 |
| 6,967,509 B2 * | 11/2005 | Rossi | 327/124 |
| 6,977,606 B2 * | 12/2005 | Daito | 341/161 |
| 6,980,148 B1 | 12/2005 | Bahai | |
| 7,009,549 B1 * | 3/2006 | Corsi | 341/161 |
| 7,034,736 B1 * | 4/2006 | Ali | 341/162 |
| 7,034,737 B1 * | 4/2006 | Huang | 341/172 |
| 7,068,202 B2 | 6/2006 | Waltari | |
| 7,084,791 B2 * | 8/2006 | Cesura et al. | 341/118 |
| 7,088,275 B2 | 8/2006 | Waltari | |
| 2002/0105451 A1 | 8/2002 | Gulati et al. | |
| 2004/0125008 A1 | 7/2004 | Yamaji | |
| 2005/0071829 A1 | 3/2005 | Bohan | |
| 2005/0140537 A1 * | 6/2005 | Waltari | 341/162 |
| 2006/0044172 A1 * | 3/2006 | Sasaki et al. | 341/161 |

OTHER PUBLICATIONS

Notice on Office Action for the counterpart Chinese Patent Application No. 200510079034.5; Mailed Apr. 4, 2008; 11 pages (including English translation).

* cited by examiner

1 …

PIPELINE A/D CONVERTER

CROSS-REFERENCE TO RELATED APPLICATIONS

This application is a Continuation of U.S. patent application Ser. No. 11/140,344, filed May 27, 2005, which was published in the English language on Dec. 15, 2005, under U.S. Patent Application Publication No. US 2005/0275579 A1 and the disclosure of which is incorporated herein by reference.

BACKGROUND OF THE INVENTION

The present invention relates to a pipeline A/D converter.

As digitization proceeds in the audiovisual field and the information and communication field, A/D converters being used as key devices in the fields are requested to have higher speed, higher resolution and lower power consumption.

A pipeline A/D converter in accordance with a conventional example will be described below with reference to FIG. 12.

FIG. 12 shows the configuration of the pipeline A/D converter in accordance with the conventional example. The operational amplifier 2 is equipped with means for sampling and holding analog input signals input from analog input signal terminals 6 and 7. Digital output signals output from the M pipe stages 1201a to 1201e are input to the digital demodulator circuit 8 and subjected to arithmetic processing, and an N-bit digital signal is output.

The M stages 1201a to 1201e have the same configuration. The number of the stages varies with each A/D converter. In the conventional example, the number of the stages is set at M. The configuration of the stage 1201a will be described below. The stage 1201a comprises an operational amplifier 1203, an A/D converter 4 and a D/A converter 5.

The output signals of the preceding stage (the operational amplifier 2) are input to the A/D converter 4 and subjected to comparison processing, and digital output signals are output. The digital output signal output from the A/D converter 4 and input to the D/A converter 5 is subjected to digital processing, and voltage values corresponding to the input digital signal are output. The output signals of the preceding stage (the operational amplifier 2) and the output signals of the D/A converter 5 are input to the operational amplifier 1203, subjected to addition (actually subtraction), amplified and output. The operational amplifier 1203 constituting each stage of this pipeline A/D converter is generally equipped with capacitance devices (capacitors). These capacitance devices (capacitors) serve as very important elements in determining the allowable conversion processing rate, power consumption and resolution of the A/D converter.

FIG. 13 is a view showing a configuration of the operational amplifier 1203 of the pipeline A/D converter in accordance with the conventional example. The peripheral circuit 21a comprises capacitance devices (capacitors) 12a and 12b, and switches 13a, 13b, 13c, 13d, 13e and 13f that are turned ON/OFF according to the clock timing shown in FIG. 4. The peripheral circuit 21b has the same configuration as that of the peripheral circuit 21a.

Next, the working of the operational amplifier 1203 shown in FIG. 13 will be described below. The operation of the peripheral circuit 21a is the same as that of the peripheral circuit 21b. The operation of the peripheral circuit 21a is described in the following description. In FIG. 13, control signal CLK1 (FIG. 4) is input to the switches 13a, 13b, 13e and 13f. These switches are turned ON in a period A and turned OFF in the other periods. Control signal CLK2 (FIG. 4) is input to the switches 13c, 13d. These switches are turned ON in a period B and turned OFF in the other periods.

First, in the period A shown in FIG. 4, the switches 13a, 13b, 13e and 13f shown in FIG. 13 are turned ON, and the other switches are turned OFF. The capacitance device (capacitor) 12a having a capacitance value C1 is charged with the charge corresponding to the voltage difference between the voltage of the signal from the analog signal input terminal 14a and the DC bias voltage from the DC bias input terminal 15a. At this time, the analog signal output terminal 19a is short-circuited to the DC bias input terminal 17a, and the voltage at the analog signal output terminal 19a becomes the DC bias voltage which is input from the DC bias input terminal 17a.

Next, in the period B shown in FIG. 4, the switches 13c and 13d shown in FIG. 13 are turned ON, and the other switches are turned OFF. The charge of the capacitance device (capacitor) 12a having been charged in the period A shown in FIG. 4 is distributed to the capacitance device (capacitor) 12b having a capacitance value C2. According to the law of conservation of charge, the differential amplifier circuit 11 amplifies the input signals from the analog signal input terminals 14a and 14b by the ratio of the capacitances of the capacitance devices (capacitors) 12a and 12b, that is, C1/C2. The differential amplifier circuit 11 outputs the amplified analog signals from the analog signal output terminals 19a and 19b.

FIG. 14 is a view showing another configuration of the operational amplifier 1203 of the pipeline A/D converter in accordance with the conventional example. The peripheral circuit 21a comprises capacitance devices (capacitors) 12a and 12b, and switches 13a, 13b, 13c, 13d, 13e and 13f that are turned ON/OFF according to the clock timing shown in FIG. 4. The peripheral circuit 21b has the same configuration as that of the peripheral circuit 21a.

Next, the working of the operational amplifier 1203 shown in FIG. 14 will be described below. The operation of the peripheral circuit 21a is the same as that of the peripheral circuit 21b. The operation of the peripheral circuit 21a is described in the following description. In FIG. 14, control signal CLK1 (FIG. 4) is input to the switches 13a, 13b, 13e and 13f. These switches are turned ON in the period A and turned OFF in the other periods. Control signal CLK2 (FIG. 4) is input to the switches 13c, 13d. These switches are turned ON in the period B and turned OFF in the other periods.

In the period A shown in FIG. 4, the switches 13a, 13b, 13e and 13f are turned ON, and the other switches are turned OFF. The capacitance device (capacitor) 12a having a capacitance value C1 and the capacitance device (capacitor) 12b having a capacitance value C2 are charged with the charge corresponding to the voltage difference between the voltage of the signal from the analog signal input terminal 14a and the DC bias voltage from the DC bias input terminal 15a. At this time, the analog signal output terminal 19a is short-circuited to the DC bias input terminal 17a, and the voltage at the analog signal output terminal 19a becomes the DC bias voltage which is input from the DC bias input terminal 17a.

In the period B shown in FIG. 4, the switches 13c and 13d shown in FIG. 14 are turned ON, and the other switches are turned OFF. The charges of the capacitance devices (capacitors) 12a and 12b, charged in the period A shown in FIG. 4, are redistributed. According to the law of conservation of charge, the differential amplifier circuit 11 amplifies the input signals from the analog signal input terminals 14a and 14b by the ratio of the capacitances of the capacitance devices (capacitors) 12a and 12b, that is, (C1+C2)/C2. The differential amplifier circuit 11 outputs the amplified analog signals from the analog signal output terminals 19a and 19b.

In the multiple stages connected in series, the allowable operation range of the operational amplifier 1203 is approximately determined by gm/C wherein gm is the transconductance of the differential amplifier circuit 11 in the preceding stage and C is the capacitance value of the operational amplifier in the subsequent stage (driven by the differential amplifier circuit 11 in the preceding stage) (FIGS. 13 and 14). This exerts an influence on the signal settling performance in the allowable operation range of the operational amplifier 1203, thereby eventually exerting an influence on the allowable conversion processing rate of the A/D converter. The power consumption of the operational amplifier 1203 is also considered as described below. The current required to charge/discharge the charge corresponding to an output signal amplitude dV of the differential amplifier circuit 11 in a constant time dt using the differential amplifier 11 to the capacitance value C of the operational amplifier 1203 in the subsequent stage being connected in series is determined by C×dV/dt. The total of these currents of the operational amplifiers 1203 in all the stages determines almost all the power consumption of the A/D converter.

Patent document 1, Japanese Laid-open Patent Application No. 2003-198368, describes a conventional technology for reducing the power consumption of the whole of an A/D converter. According to the conventional technology described in Patent document 1, the current flowing in a differential amplifier circuit constituting an operational amplifier is controlled, whereby the transconductance gm of the differential amplifier circuit is changed and the resolution required for the A/D converter is changed. Hence, in the case that the performance of the A/D converter is higher than the performance required for the A/D converter, the current flowing in the differential amplifier circuit can be decreased, and the power consumption of the whole of the A/D converter can be reduced.

As described in "IEEE J. SOLID-STATE CIRCUITS, Vol. 36, pp. 1931-1936, December 2001 [A 3-V 340-mW 14-b 75-Msample/s CMOS ADC With 85-dB SFDR]," for the purpose of satisfying a resolution required for a pipeline A/D converter, the relative accuracy of the capacitances of the capacitance devices (FIGS. 13 and 14) constituting an operational amplifier determines the resolution of the A/D converter. Generally speaking, the larger the capacitance value, the higher the relative accuracy of the capacitance. It is thus known to be necessary to determine the capacitance value matching to the resolution on the basis of the relative accuracy of the capacitance.

As described above, the capacitance devices (capacitors) constituting the operational amplifier are very important to determine the allowable conversion processing rate, power consumption and resolution of the pipeline A/D converter. Conventionally, the capacitance values of the capacitance devices (capacitors) were fixed values matching to the performance required for the A/D converter.

As described above, in the conventional pipeline A/D converter, even in the case that the performance required for the A/D converter being used in a system is changed, the capacitance values of the capacitance devices (capacitors) of the operational amplifier constituting the pipeline A/D converter are fixed. As a result, the performance of the A/D converter cannot be changed. In the case that the performance of the A/D converter being used in the system is higher than the performance required for the A/D converter, the A/D converter has wasteful allowable conversion processing rate and wasteful resolution and consumes wasteful power, each wasted by the amount corresponding to the excess performance.

Furthermore, even in the case that the allowable conversion processing rate, resolution and power consumption of the A/D converter are lowered by controlling the current flowing in the differential amplifier circuit constituting the operational amplifier, as long as the capacitance values of the capacitance devices of the operational amplifier are fixed the reduction of the power consumption is determined by the fixed capacitance values. Therefore, further reduction of the power consumption cannot be attained.

BRIEF SUMMARY OF THE INVENTION

The present invention is intended to provide a pipeline A/D converter capable of being internally set so as to satisfy required allowable conversion processing rate and resolution.

The present invention is intended to provide a pipeline A/D converter being internally set automatically so as to satisfy required allowable conversion processing rate and resolution.

The present invention is intended to provide a pipeline A/D converter having low power consumption and capable of being internally set so as to satisfy required allowable conversion processing rate and resolution.

The present invention is intended to provide a pipeline A/D converter having low power consumption and being internally set automatically so as to satisfy required allowable conversion processing rate and resolution.

For the purpose of attaining these objects, the present invention has a configuration described below. A pipeline A/D converter in accordance with an aspect of the present invention comprises a control section for outputting a control signal according to the operation state of an apparatus incorporating the pipeline A/D converter, and a pipeline A/D conversion section, the resolution and/or allowable conversion processing rate of which are switched by switching the capacitance in a built-in operational amplifier according to the control signal.

With this configuration, in the case that the performance requested by the apparatus is changed, the performance of the pipeline A/D converter is set adaptively according to the change of the state. The pipeline A/D converter is internally set suitably so as to just sufficiently deliver the performance requested for the pipeline A/D converter by the apparatus. The resolution of the pipeline A/D converter can be raised by switching the capacitance in the operational amplifier incorporated in each stage of the pipeline A/D converter to a large value. The value of the capacitance connected to the output of a differential amplifier circuit constituting the operational amplifier is made small by switching the capacitance in the operational amplifier to a small value. The maximum operation frequency of the operational amplifier is thus raised. Hence, the allowable conversion processing rate of the A/D converter can be raised.

The apparatus incorporating the pipeline A/D converter and the state of the operation thereof are optional. For example, it is assumed that the pipeline A/D converter is a video signal A/D converter incorporated in an electronic camera. In the case that the electronic camera is in its recording mode (a video signal output from a CCD is A/D converted at high resolution and recorded on a recording medium), the resolution of the pipeline A/D converter is set at 14-bit accuracy. In the case that the electronic camera is in its reproduction mode (a reproduction video signal is A/D converted at low resolution and displayed on a liquid crystal monitor display), the resolution of the pipeline A/D converter is set automatically at 12-bit accuracy.

A pipeline A/D converter in accordance with another aspect of the present invention comprises a control section that outputs a test signal, receives a digital signal output from a pipeline A/D conversion section to which the test signal has been input, tests whether the digital signal is proper or not, and outputs a control signal according to the result of the test, and the pipeline A/D conversion section, the resolution of which is switched by switching the capacitance in a built-in operational amplifier according to the control signal.

When the control section detects performance degradation of the pipeline A/D conversion section, the control section outputs a control signal for raising the resolution to the pipeline A/D conversion section, and when excess performance is detected the control section outputs a control signal for lowering the resolution to the pipeline A/D conversion section.

The present invention can realize a pipeline A/D converter having high performance stability and being internally set automatically so as to satisfy required resolution.

A pipeline A/D converter in accordance with still another aspect of the present invention comprises a control section that outputs a test signal, receives a digital signal output from a pipeline A/D conversion section to which the test signal has been input, tests whether the digital signal is proper or not and outputs a control signal according to the result of the test, and the pipeline A/D conversion section, the allowable conversion processing rate of which is switched by switching the capacitance in a built-in operational amplifier according to the control signal.

When the control section detects performance degradation of the pipeline A/D conversion section, the control section outputs a control signal for raising the allowable conversion processing rate to the pipeline A/D conversion section, and when excess performance is detected the control section outputs a control signal for lowering the allowable conversion processing rate to the pipeline A/D conversion section.

The present invention can realize a pipeline A/D converter having high performance stability and being internally set automatically so as to satisfy required resolution.

A pipeline A/D converter in accordance with still another aspect of the present invention is characterized in that the control section outputs the test signal at the time when an apparatus incorporating the pipeline A/D converter is in a predetermined state.

The pipeline A/D converter is internally set automatically at given timing wherein the behavior of the whole of an apparatus incorporating the pipeline A/D converter is not affected. Hence, the pipeline A/D converter can be internally set automatically so as to satisfy required resolution and/or allowable conversion processing rate without interfering with the functions and operation of the apparatus.

A pipeline A/D converter in accordance with still another aspect of the present invention is characterized in that the control section further switches the conductance of the output stage of a differential amplifier circuit incorporated in the operational amplifier according to the capacitance in the operational amplifier, the capacitance having been switched according to the control signal.

In the case that the capacitance in the operational amplifier is switched, the conductance of the output stage of the differential amplifier circuit is switched accordingly. Hence, the current flowing in the differential amplifier circuit can be changed so as to have an amount satisfying the performance of the pipeline A/D converter. For example, when the control section judges that the present setting is of excess performance and then lowers the capacitance in the operational amplifier (lowers the resolution), the control section lowers the conductance of the output stage of the differential amplifier circuit according to the capacitance value having been lowered. In other words, the current flowing in the differential amplifier circuit is decreased. Hence, the power consumption of the pipeline A/D converter can be reduced, and the power consumption of the whole apparatus incorporating the pipeline A/D converter can be reduced. The power consumption and resolution can be changed according to the resolution requested by the apparatus, and it is thus possible to switch the current flowing in the differential amplifier circuit in the operational amplifier and the capacitance in the operational amplifier. Hence, further power reduction can be attained in comparison with the case wherein only the current flowing in the differential amplifier circuit in the operational amplifier is switched.

Furthermore, for example, the allowable conversion processing rate can be raised by increasing the conductance of the output stage of the differential amplifier circuit. The resolution can be raised by decreasing the conductance of the output stage of the differential amplifier circuit.

A pipeline A/D converter in accordance with still another aspect of the present invention, having a first mode and a second mode and comprising multiple stages connected by pipelines, is characterized in that at least one of the stages comprises an amplifier, a first pair of a first capacitor and a second capacitor, and a second pair of a third capacitor and a fourth capacitor, wherein in the first mode, the amplifier amplifies the analog input signal at the amplification factor corresponding to the capacitance of the first pair of capacitors and outputs an amplified signal, and in the second mode, the amplifier amplifies the analog input signal at the amplification factor corresponding to the capacitance of only the second pair of capacitors or the capacitance of the first and second pairs of capacitors and outputs an amplified signal.

A pipeline A/D converter in accordance with still another aspect of the present invention is characterized in that at least one of the stages comprises an amplifier; a first pair of a first capacitor and a second capacitor connected in series, at least the first capacitor being charged with the charge corresponding to the analog input signal in a first period, the charges stored in the first capacitor and the second capacitor being redistributed in a second period while current flow is prevented at the connection point of the first capacitor and the second capacitor, the connection point of the first capacitor and the second capacitor being connected to the input terminal of the amplifier, and one terminal of the second capacitor, not connected to the first capacitor, being connected to the output terminal of the amplifier; and a second pair of a third capacitor and a fourth capacitor connected in series, at least the third capacitor being charged with the charge corresponding to the analog input signal in the first period, the charges stored in the third capacitor and the fourth capacitor being redistributed in the second period while current flowing is prevented at the connection point of the third capacitor and the fourth capacitor, the connection point of the third capacitor and the fourth capacitor being connected to the input terminal of the amplifier, and one terminal of the fourth capacitor, not connected to the third capacitor, being connected to the output terminal of the amplifier.

A pipeline A/D converter in accordance with still another aspect of the present invention is characterized in that the stage further comprises a first switch, one terminal of which receives the analog input signal and the other terminal of which is connected to one terminal of the first capacitor, not connected to the second capacitor, and the switch being turned ON in the first period and turned OFF in the second period; a second switch, one terminal of which is connected to the connection point of the first switch and the first capacitor, the switch being turned OFF in the first period and turned ON in the second period, and at least the potential at the other terminal of the first capacitor being input to the amplifier; a third switch, one terminal of which receives a DC bias voltage and the other terminal of which is connected to the connection point of the first capacitor and the second capacitor, and the switch being turned ON in the first period and turned OFF in the second period; a fourth switch, one terminal of which receives the analog input signal or the DC bias voltage and the other terminal of which is connected to one terminal of the second capacitor, not connected to the first capacitor, and the switch being turned ON in the first period and turned OFF in the second period; a fifth switch, one terminal of which is connected to the connection point of the second capacitor and the fourth switch and the other terminal of which is connected to the output terminal of the amplifier, and the switch being turned OFF in the first period and turned ON in the second period; a sixth switch, one terminal of which receives the analog input signal and the other terminal of which is connected to one terminal of the third capacitor, not connected to the fourth capacitor, and the switch being turned ON in the first period and turned OFF in the second period; a seventh switch, one terminal of which is connected to the connection point of the sixth switch and the third capacitor, the switch being turned OFF in the first period and turned ON in the second period, and at least the potential at the other terminal of the third capacitor being input to the amplifier; an eighth switch, one terminal of which receives the DC bias voltage and the other terminal of which is connected to the connection point of the third capacitor and the fourth capacitor, and the switch being turned ON in the first period and turned OFF in the second period; a ninth switch, one terminal of which receives the analog input signal or the DC bias voltage and the other terminal of which is connected to one terminal of the fourth capacitor, not connected to the third capacitor, and the switch being turned ON in the first period and turned OFF in the second period; and a tenth switch, one terminal of which is connected to the connection point of the fourth capacitor and the ninth switch and the other terminal of which is connected to the output terminal of the amplifier, and the switch being turned OFF in the first period and turned ON in the second period.

With the above-mentioned configuration, it is possible to realize a pipeline A/D converter, the resolution and/or the allowable conversion processing rate of which can be switched suitably by carrying out switching between the first mode and the second mode. The number of the modes may be more than two.

A pipeline A/D converter in accordance with still another aspect of the present invention is characterized in that the conductance of the output stage of the amplifier is switched according to the mode.

In the case that the capacitance in the operational amplifier is switched, the conductance of the output stage of the differential amplifier is switched accordingly. Hence, the current can be changed so as to have an amount satisfying the performance of the pipeline A/D converter.

A pipeline A/D converter in accordance with still another aspect of the present invention is characterized in that the mode is fixed using electrical wiring.

The capacitance to be used in the operational amplifier constituting each stage is set by electrical wiring, such as wiring and fusing during semiconductor assembly, whereby the resolution and allowable conversion processing rate of the A/D converter can be determined.

The present invention provides an advantageous effect that can realize a pipeline A/D converter capable of being internally set so as to satisfy required allowable conversion processing rate and resolution.

The present invention provides an advantageous effect that can realize a pipeline A/D converter being internally set automatically so as to satisfy required allowable conversion processing rate and resolution.

The present invention provides an advantageous effect that can realize a pipeline A/D converter having low power consumption and capable of being internally set so as to satisfy required allowable conversion processing rate and resolution.

The present invention provides an advantageous effect that can realize a pipeline A/D converter having low power consumption and being internally set automatically so as to satisfy required allowable conversion processing rate and resolution.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Embodiments in accordance with the present invention will be described below.

Embodiment 1

Figure 1:
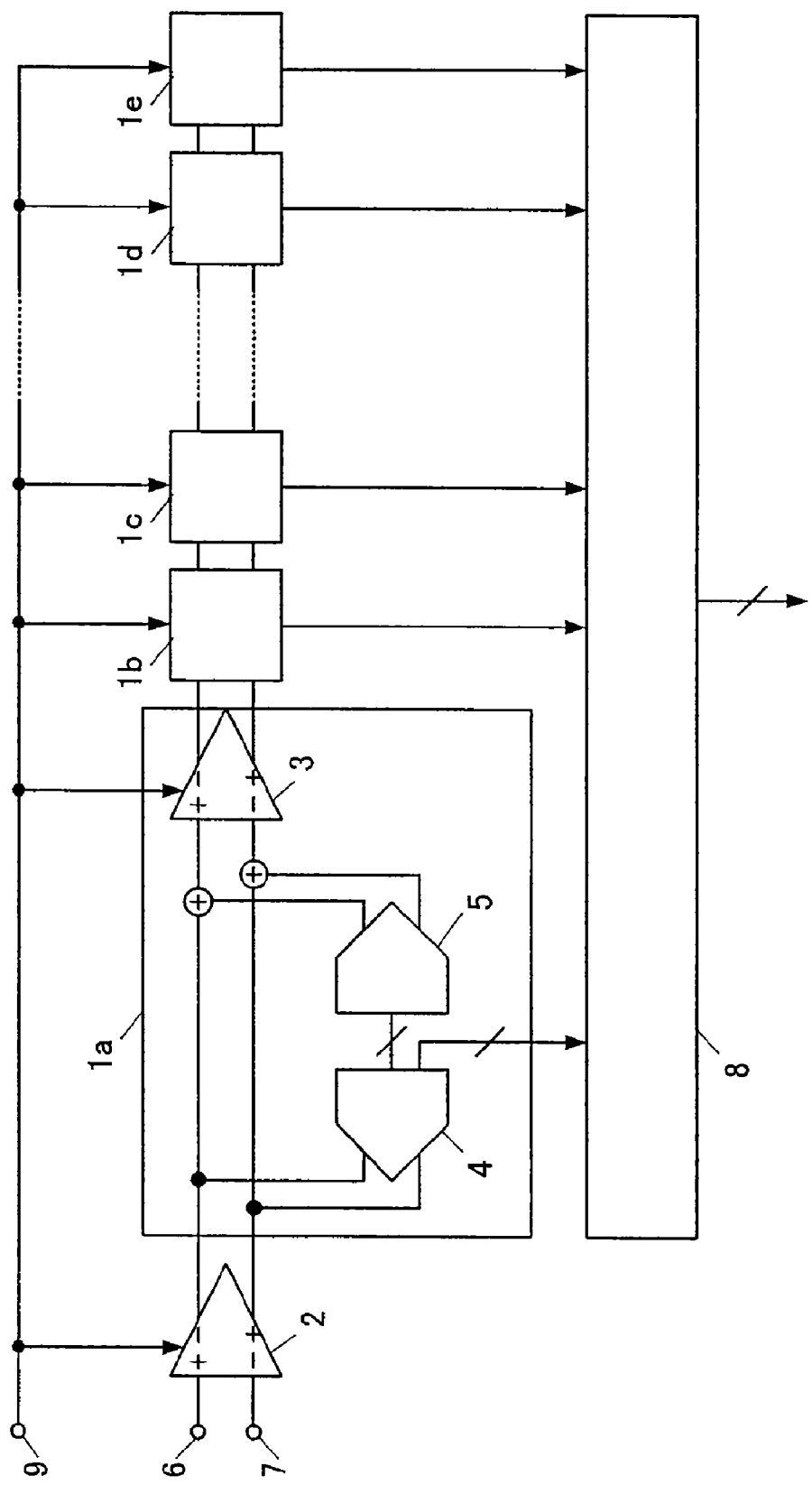
FIG. 1 is a view showing the configuration of a pipeline A/D converter in accordance with Embodiment 1.

A pipeline A/D converter in accordance with Embodiment 1 of the present invention will be described with reference to using FIGS. 1 to 4. FIG. 1 is a view showing the configuration of the pipeline A/D converter in accordance with Embodiment 1 of the present invention.

The operational amplifier 2 is equipped with means for sampling and holding analog input signals input from analog input signal terminals 6 and 7. The digital output signals which are respectively output from M pipe stages 1a to 1e are input to the digital demodulator circuit 8 and subjected to arithmetic processing, and an N-bit digital signal is output.

The M stages 1a to 1e have the same configuration. The number of the stages varies with each A/D converter. In Embodiment 1, the number of the stages is set M. The configuration of the stage 1a will be described below. The stage 1a comprises an operational amplifier 3, an A/D converter 4 and a D/A converter 5.

The output signals of the preceding stage (the operational amplifier 2) are input to the A/D converter 4 and subjected to comparison processing, and digital output signals are output. The digital output signal output from the A/D converter 4 and input to the D/A converter 5 is subjected to digital processing, and voltage values corresponding to the input digital signal are output. The output signals of the preceding stage (the operational amplifier 2) and the output signals of the D/A converter 5 are input to the operational amplifier 3, subjected to addition (actually subtraction), amplified and output.

A control signal is input from the outside to a control signal input terminal 9 and supplied to the operational amplifier 2 and the operational amplifiers 3 in the pipe stages 1a to 1e.

Figure 2:
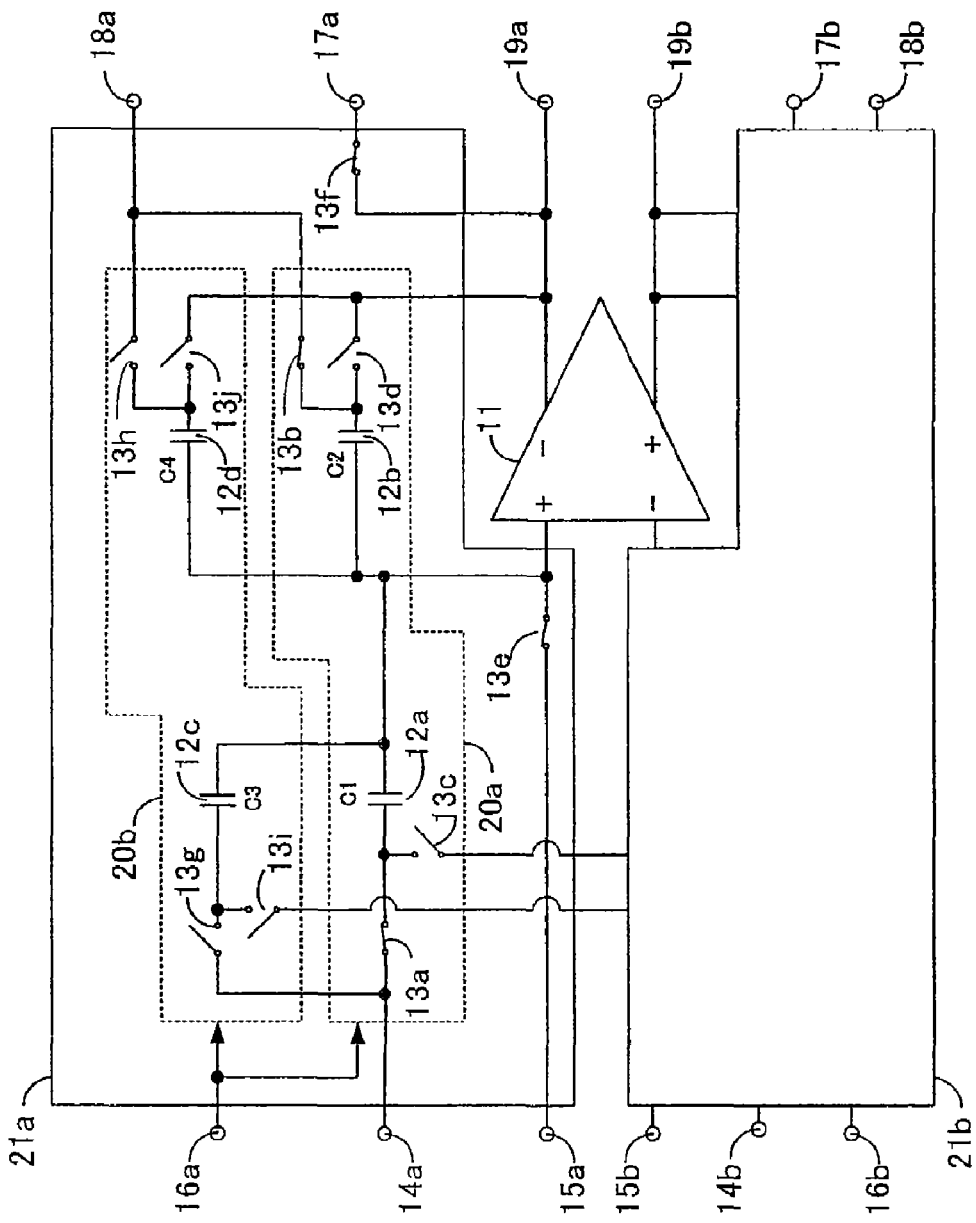
FIG. 2 is a view showing a configuration of an operational amplifier constituting the pipeline A/D converter in accordance with Embodiment 1.
Figure 4:
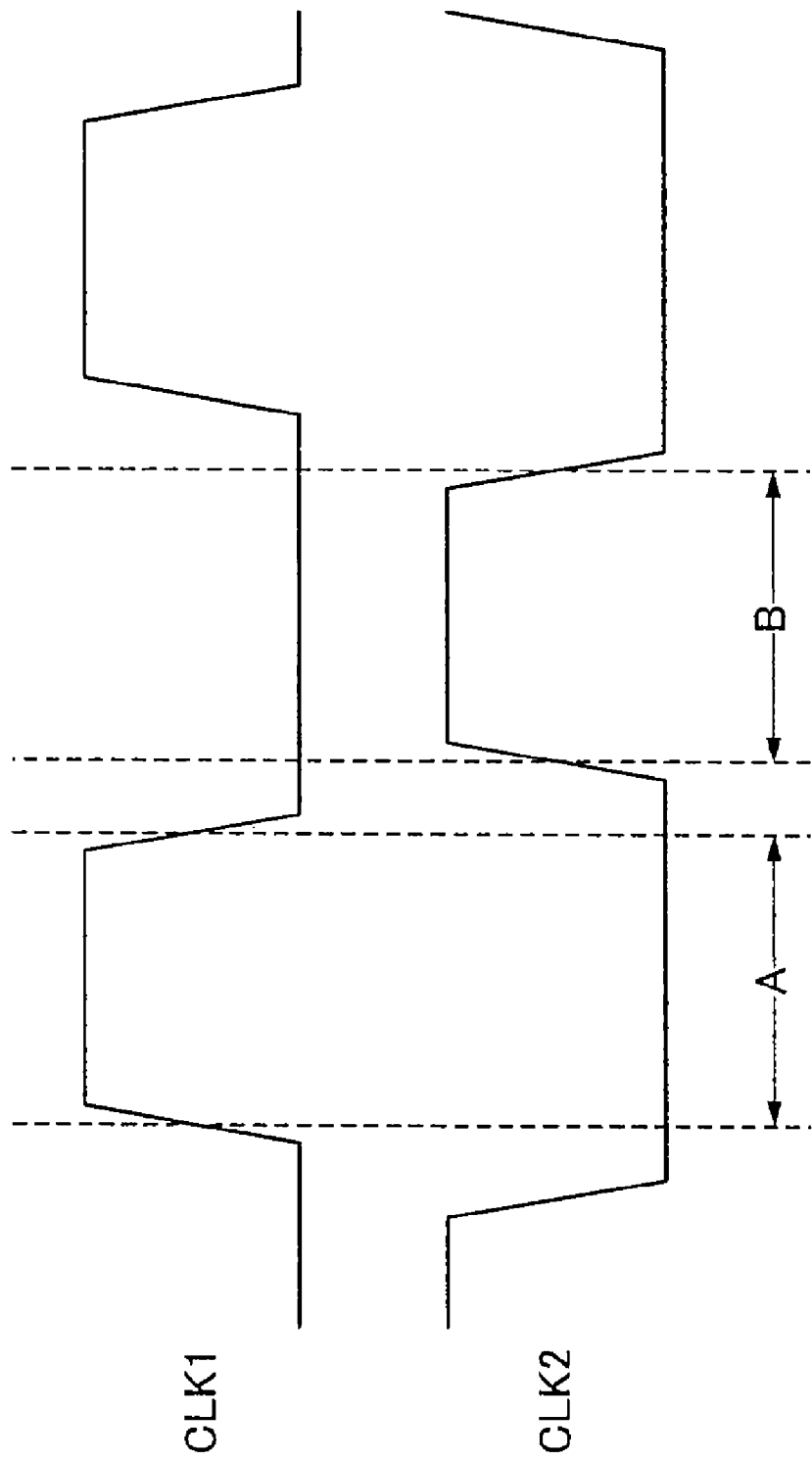
FIG. 4 is a timing chart of the pipeline A/D converter.

FIG. 2 is a view showing a configuration of the operational amplifiers 2 and 3 in accordance with Embodiment 1 of the present invention. FIG. 4 is a timing chart for two clock signals CLK1 and CLK2 to be input to the operational amplifiers 2 and 3.

The peripheral circuit 21a comprises capacitance devices (capacitors) 12a, 12b, 12c and 12d, and switches 13a, 13b, 13c, 13d, 13e, 13f, 13g, 13h, 13i and 13j that ar according to the clock timing shown in FIG. 4. The peripheral circuit 21b has the same configuration as that of the peripheral circuit 21a.

The peripheral circuit 21a has a switch-capacitance device (capacitor) group 20a comprising the capacitance devices (capacitors) 12a and 12b and the switches 13a, 13b, 13c and 13d, and a switch-capacitance device (capacitor) group 20b comprising the capacitance devices (capacitors) 12c and 12d and the switches 13g, 13h, 13i and 13j.

The capacitance devices (capacitors) 12a and 12b in the switch-capacitance device (capacitor) group 20a and the capacitance devices (capacitors) 12c and 12d in the switch-capacitance device (capacitor) group 20b have different capacitance values suited for different resolution values. In Embodiment 1, the capacitance devices (capacitors) in the switch-capacitance device (capacitor) group 20a are set to have capacitance values suited for high resolution. The capacitance devices (capacitors) in the switch-capacitance device (capacitor) group 20b are set to have capacitance values suited for low resolution.

Generally speaking, the capacitance values of the capacitance devices (capacitors) of the pipeline A/D converter are determined on the basis of the relative accuracy of the capacitance. The larger the capacitance value of the capacitor, the higher the relative accuracy of the capacitance. It is thus necessary to set the capacitance value in the case of attaining high resolution so as to be larger than the capacitance value in the case of attaining low resolution. The capacitance values C1 and C2 of the capacitance devices (capacitors) 12a and 12b in the switch-capacitance device (capacitor) group 20a are larger than the capacitance values C3 and C4 of the capacitance devices (capacitors) 12c and 12d in the switch-capacitance device (capacitor) group 20b.

The control signal input from the outside to the control signal input terminal 9 is input to the switch-capacitance device (capacitor) groups 20a and 20b via the control signal input terminal 16a (16b). In Embodiment 1, when the control signal input to the control signal input terminal 16a has High level, the switches 13a, 13b, 13c and 13d in the switch-capacitance device (capacitor) group 20a are operated. The switches 13g, 13h, 13i and 13j in the switch-capacitance device (capacitor) group 20b are not operated. In the period A shown in FIG. 4, the switches 13a, 13b, 13e and 13f to which CLK1 is input as a control signal are turned ON, and the other switches are turned OFF. In the period B shown in FIG. 4, the switches 13c and 13d to which CLK2 is input as a control signal are turned ON, and the other switches are turned OFF.

When the control signal input to the control signal input terminal 16a has Low level, the switches 13a, 13b, 13c and 13d in the switch-capacitance device (capacitor) group 20a are not operated. The switches 13g, 13h, 13i and 13j in the switch-capacitance device (capacitor) group 20b are operated. In the period A shown in FIG. 4, the switches 13g, 13h, 13e and 13f to which CLK1 is input as a control signal are turned ON, and the other switches are turned OFF. In the period B shown in FIG. 4, the switches 13i and 13j to which CLK2 is input as a control signal are turned ON, and the other switches are turned OFF.

The operation of the operational amplifier 3 shown in FIG. 2 will be described with respect to the peripheral circuit 21a. The internal operation of the peripheral circuit 21b shown in FIG. 2 is the same as the operation of the peripheral circuit 21a. It is assumed that the A/D converter in accordance with Embodiment 1 is incorporated in an electronic camera and that a video signal output from a CCD is A/D converted. In the case that the electronic camera is in its recording mode (a video signal output from a CCD is A/D converted at high resolution and recorded on a recording medium), the resolution of the pipeline A/D converter is set at 14-bit accuracy. In the case that the electronic camera is in its reproduction mode (a reproduction video signal is A/D converted at low resolution and displayed on a liquid crystal monitor display), the resolution of the pipeline A/D converter is set automatically at 12-bit accuracy.

In the case that the electronic camera is in its recording mode, the control section of the electronic camera sets the A/D converter so as to have high resolution. The control section of the electronic camera inputs a control signal to the control signal input terminal 16a and selects the switch-capacitance device (capacitor) group 20a.

The switches 13a, 13b, 13c and 13d in the switch-capacitance device (capacitor) group 20a are turned ON/OFF according to CLK1 and CLK2. The switches 13g, 13h, 13i and 13j in the switch-capacitance device (capacitor) group 20b are OFF at all times.

In the period A of the clock timing shown in FIG. 4, the switches 13a, 13b, 13e and 13f shown in FIG. 2 are turned ON, and the other switches are turned OFF. The capacitance device (capacitor) 12a is charged with the charge corresponding to the voltage difference between the voltage of the signal from the analog signal input terminal 14a and the DC bias voltage from the DC bias input terminal 15a. At this time, the analog signal output terminal 19a is short-circuited to the DC bias input terminal 17a, and the voltage at the analog signal output terminal 19a becomes the DC bias which is voltage input from the DC bias input terminal 17a.

Next, in the period B shown in FIG. 4, the switches 13c and 13d shown in FIG. 2 are turned ON, and the other switches are turned OFF. The charge of the capacitance device (capacitor) 12a having been charged in the period A shown in FIG. 4 is distributed to the capacitance device (capacitor) 12b. According to the law of conservation of charge, the differential amplifier circuit 11 amplifies the input signals from the analog signal input terminals 14a and 14b by the ratio of the capacitances of the capacitance devices (capacitors) 12a and 12b, that is, C1/C2. The differential amplifier circuit 11 outputs the amplified analog signals from the analog signal output terminals 19a and 19b.

Next, in the case that the electronic camera is in its reproduction mode, the control section of the electronic camera sets the A/D converter so as to have low resolution. The control section of the electronic camera inputs a control signal to the control signal input terminal 16a and selects the switch-capacitance device (capacitor) group 20b. The switches 13g, 13h, 13i and 13j in the switch-capacitance device (capacitor) group 20b are turned ON/OFF according to CLK1 and CLK2. The switches 13a, 13b, 13c and 13d in the switch-capacitance device (capacitor) group 20a are OFF at all times.

In the period A of the clock timing shown in FIG. 4, the switches 13g, 13h, 13e and 13f shown in FIG. 2 are turned ON, and the other switches are turned OFF. The capacitance device (capacitor) 12c is charged with the charge corresponding to the voltage difference between the voltage of the signal from the analog signal input terminal 14a and the DC bias voltage from the DC bias input terminal 15a. At this time, the analog signal output terminals 19a and 19b are short-circuited to the DC bias input terminals 17a and 17b, respectively. Hence, the voltages at the analog signal output terminals 19a and 19b become the DC bias voltages input from the DC bias input terminals 17a and 17b, respectively.

Next, in the period B shown in FIG. 4, the switches 13i and 13j shown in FIG. 2 are turned ON, and the other switches are turned OFF. The charge of the capacitance device (capacitor) 12c having been charged in the period A shown in FIG. 4 is distributed to the capacitance device (capacitor) 12d. According to the law of conservation of charge, the differential amplifier circuit 11 amplifies the input signals from the analog signal input terminals 14a and 14b by the ratio of the capacitances of the capacitance devices (capacitors) 12c and 12d, that is, C3/C4. The differential amplifier circuit 11 outputs the amplified analog signals from the analog signal output terminals 19a and 19b.

Figure 3:
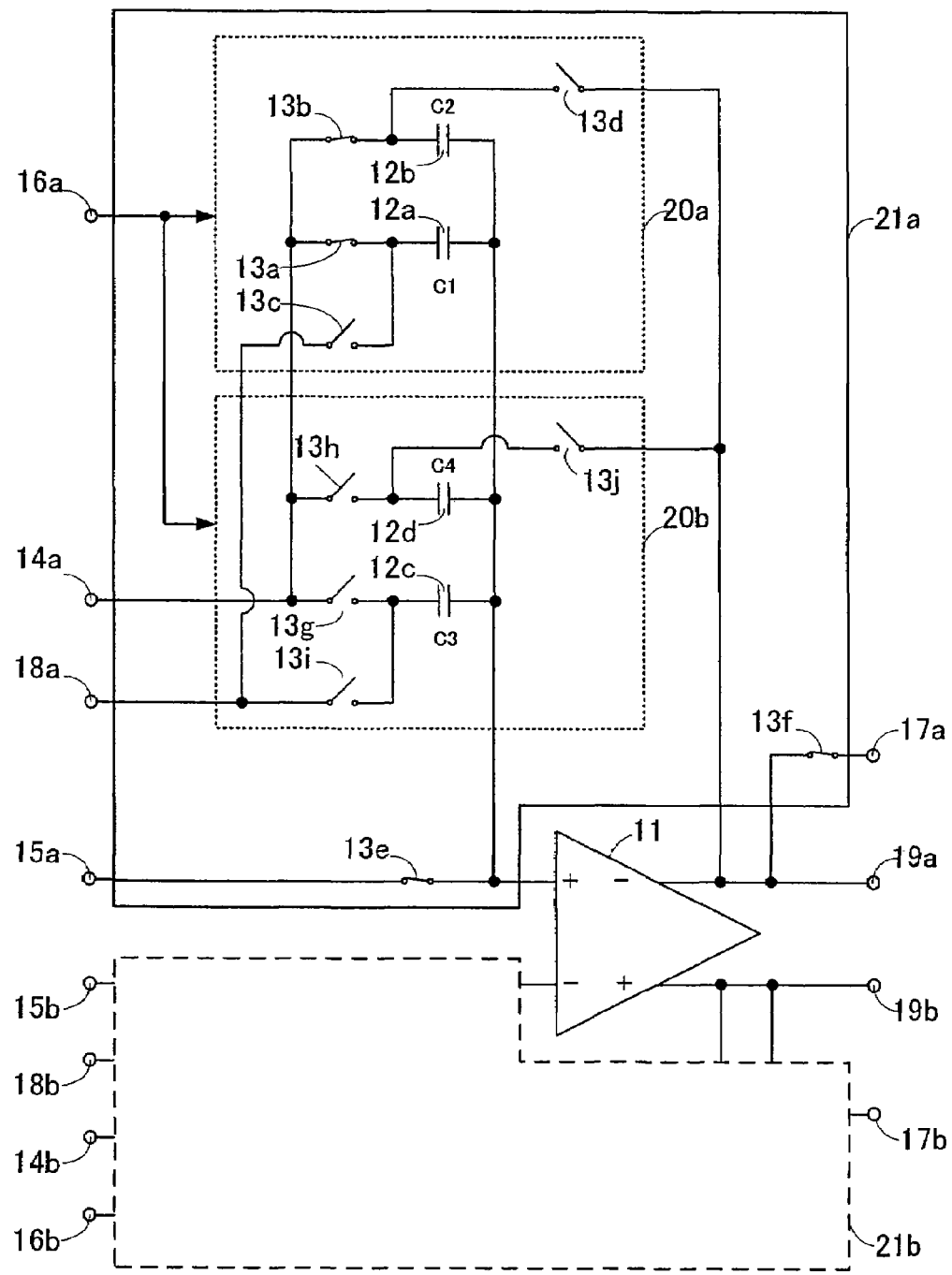
FIG. 3 is a view showing another configuration of the operational amplifier constituting the pipeline A/D converter in accordance with Embodiment 1.

A configuration example of the operational amplifiers 2 and 3 shown in FIG. 3 will be described below. FIG. 3 is a view showing another configuration of the operational amplifiers 2 and 3 in accordance with Embodiment 1 of the present invention. In FIG. 3, numeral 11 designates a differential amplifier circuit, numerals 21a and 21b designate peripheral circuits, numerals 14a and 14b designate analog signal input terminals, numerals 15a, 15b, 17a, 17b, 18a and 18b designate DC bias input terminals, numerals 19a and 19b designate analog signal output terminals, and numerals 16a and 16b designate control signal input terminals.

The peripheral circuit 21a comprises capacitance devices (capacitors) 12a, 12b, 12c and 12d, and switches 13a, 13b, 13c, 13d, 13e, 13f, 13g, 13h, 13i and 13j that ar according to the clock timing shown in FIG. 4. The peripheral circuit 21b has the same configuration as that of the peripheral circuit 21a.

The peripheral circuit 21a has a switch-capacitance device (capacitor) group 20a comprising the capacitance devices (capacitors) 12a and 12b and the switches 13a, 13b, 13c and 13d, and a switch-capacitance device (capacitor) group 20b comprising the capacitance devices (capacitors) 12c and 12d and the switches 13g, 13h, 13i and 13j.

The capacitance devices (capacitors) 12a and 12b in the switch-capacitance device (capacitor) group 20a and the capacitance devices (capacitors) 12c and 12d in the switch-capacitance device (capacitor) group 20b have different capacitance values suited for different resolution values. In Embodiment 1, the capacitance devices (capacitors) in the switch-capacitance device (capacitor) group 20a are set to have capacitance values suited for high resolution. The capacitance devices (capacitors) in the switch-capacitance device (capacitor) group 20b are set to have capacitance values suited for low resolution.

The capacitance values C1 and C2 of the capacitance devices (capacitors) 12a and 12b in the switch-capacitance device (capacitor) group 20a are larger than the capacitance values C3 and C4 of the capacitance devices (capacitors) 12c and 12d in the switch-capacitance device (capacitor) group 20b.

The control signal input from the outside to the control signal input terminal 9 is input to the switch-capacitance device (capacitor) groups 20a and 20b via the control signal input terminal 16a (16b). In Embodiment 1, when the control signal input to the control signal input terminal 16a has High level, the switches 13a, 13b, 13c and 13d in the switch-capacitance device (capacitor) group 20a are operated. The switches 13g, 13h, 13i and 13j in the switch-capacitance device (capacitor) group 20b are not operated. In the period A shown in FIG. 4, the switches 13a, 13b, 13e and 13f to which CLK1 is input as a control signal are turned ON, and the other switches are turned OFF. In the period B shown in FIG. 4, the switches 13c and 13d to which CLK2 is input as a control signal are turned ON, and the other switches are turned OFF.

When the control signal input to the control signal input terminal 16a has Low level, the switches 13a, 13b, 13c and 13d in the switch-capacitance device (capacitor) group 20a are not operated. The switches 13g, 13h, 13i and 13j in the switch-capacitance device (capacitor) group 20b are operated. In the period A shown in FIG. 4, the switches 13g, 13h, 13e and 13f to which CLK1 is input as a control signal are turned ON, and the other switches are turned OFF. In the period B shown in FIG. 4, the switches 13i and 13j to which CLK2 is input as a control signal are turned ON, and the other switches are turned OFF.

The working of the operational amplifier 3 shown in FIG. 3 will be described with respect to the peripheral circuit 21a. The internal operation of the peripheral circuit 21b shown in FIG. 3 is the same as the operation of the peripheral circuit 21a. It is assumed that the A/D converter in accordance with Embodiment 1 is incorporated in an electronic camera. In the case that the electronic camera is in its recording mode (a video signal output from a CCD is A/D converted at high resolution and recorded on a recording medium), the resolution of the pipeline A/D converter is set at 14-bit accuracy. In the case that the electronic camera is in its reproduction mode (a reproduction video signal is A/D converted at low resolution and displayed on a liquid crystal monitor display), the resolution of the pipeline A/D converter is set automatically at 12-bit accuracy.

In the case that the electronic camera is in its recording mode, the control section of the electronic camera sets the A/D converter so as to have high resolution. The control section of the electronic camera inputs a control signal to the control signal input terminal 16a and selects the switch-capacitance device (capacitor) group 20a.

The switches 13a, 13b, 13c and 13d in the switch-capacitance device (capacitor) group 20a are turned ON/OFF according to CLK1 and CLK2. The switches 13g, 13h, 13i and 13j in the switch-capacitance device (capacitor) group 20b are OFF at all times.

In the period A of the clock timing shown in FIG. 4, the switches 13a, 13b, 13e and 13f shown in FIG. 3 are turned ON, and the other switches are turned OFF. The capacitance device (capacitor) 12a is charged with the charge corresponding to the voltage difference between the voltage of the signal from the analog signal input terminal 14a and the DC bias voltage from the DC bias input terminal 15a. At this time, the analog signal output terminal 19a is short-circuited to the DC bias input terminal 17a, and the voltage at the analog signal output terminal 19a becomes the DC bias voltage which is input from the DC bias input terminal 17a.

Next, in the period B shown in FIG. 4, the switches 13c and 13d shown in FIG. 3 are turned ON, and the other switches are turned OFF. One terminal of the capacitance device (capacitor) 12a is short-circuited to the DC bias input terminal 18a, and the voltage at the terminal becomes the DC bias voltage which is input from the DC bias input terminal 18a. One terminal of the capacitance device (capacitor) 12b is short-circuited to the analog signal output terminal 19a. The charges of the capacitance device (capacitor) 12a and 12b having been charged in the period A shown in FIG. 4 are redistributed. According to the law of conservation of charge, the differential amplifier circuit 11 amplifies the input signals from the analog signal input terminals 14a and 14b by the ratio of the capacitances of the capacitance devices (capacitors) 12a and 12b, that is, (C1+C2)/C2. The differential amplifier circuit 11 outputs the amplified analog signals from the analog signal output terminals 19a and 19b.

Next, in the case that the electronic camera is in its reproduction mode, the control section of the electronic camera sets the A/D converter so as to have low resolution. The control section of the electronic camera inputs a control signal to the control signal input terminal 16a and selects the switch-capacitance device (capacitor) group 20b. The switches 13g, 13h, 13i and 13j in the switch-capacitance device (capacitor) group 20b are turned ON/OFF according to CLK1 and CLK2. The switches 13a, 13b, 13c and 13d in the switch-capacitance device (capacitor) group 20a are OFF at all times.

In the period A of the clock timing shown in FIG. 4, the switches 13g, 13h, 13e and 13f shown in FIG. 3 are turned ON, and the other switches are turned OFF. The capacitance device (capacitor) 12c is charged with the charge corresponding to the voltage difference between the voltage of the signal from the analog signal input terminal 14a and the DC bias voltage from the DC bias input terminal 15a. At this time, the analog signal output terminals 19a and 19b are short-circuited to the DC bias input terminals 17a and 17b, respectively. Hence, the voltages at the analog signal output terminals 19a and 19b become the DC bias voltages input from the DC bias input terminals 17a and 17b, respectively.

Next, in the period B shown in FIG. 4, the switches 13i and 13j shown in FIG. 3 are turned ON, and the other switches are turned OFF. One terminal of the capacitance device (capacitor) 12c is short-circuited to the DC bias input terminal 18a, and the voltage at the terminal becomes the DC bias voltage which is input from the DC bias input terminal 18a. One terminal of the capacitance device (capacitor) 12d is short-circuited to the analog signal output terminal 19a. The charges of the capacitance device (capacitor) 12c and 12d having been charged in the period A shown in FIG. 4 are redistributed. According to the law of conservation of charge, the differential amplifier circuit 11 amplifies the input signals from the analog signal input terminals 14a and 14b by the ratio of the capacitances of the capacitance devices (capacitors) 12c and 12d, that is, (C3+C4)/C4. The differential amplifier circuit 11 outputs the amplified analog signals from the analog signal output terminals 19a and 19b.

With the above-mentioned configuration of the pipeline A/D converter in accordance with Embodiment 1 of the present invention, capacitance value switching can be carried out using the control signal from the control signal input terminal 9 shown in FIG. 1. Hence, the resolution of the pipeline A/D converter can be changed.

Furthermore, since the capacitance values of the capacitance devices (capacitors) in each stage are changed, the load of the output stage of the operational amplifier in each stage is changed, whereby the allowable operation range of the operational amplifier is changed just as the resolution is changed. As a result, the allowable conversion processing rate of the A/D converter can be changed.

Generally speaking, as described above, the capacitance value is set at a large value in the case that high resolution is required. The resolution can be lowered and the allowable conversion processing rate can be raised without changing the power consumption of the pipeline A/D converter by decreasing the capacitance of each stage. Alternatively, the resolution can be raised and the allowable conversion processing rate can be lowered without changing the power consumption of the pipeline A/D converter by increasing the capacitance of each stage.

In Embodiment 1, two kinds of switching are used for the switching of the capacitance devices (capacitors) according to the control signal from the control signal input terminal 9 shown in FIG. 1. However, it may be possible to use various kinds of switching.

Furthermore, in the case that the control signal has Low level, only the switch-capacitance device (capacitor) group 20b shown in FIGS. 2 and 3 may be selected and operated. In the case that the control signal has High level, both the switch-capacitance device (capacitor) groups 20a and 20b shown in FIGS. 2 and 3 may be selected and operated in conjunction with each other.

Embodiment 2

Figure 5:
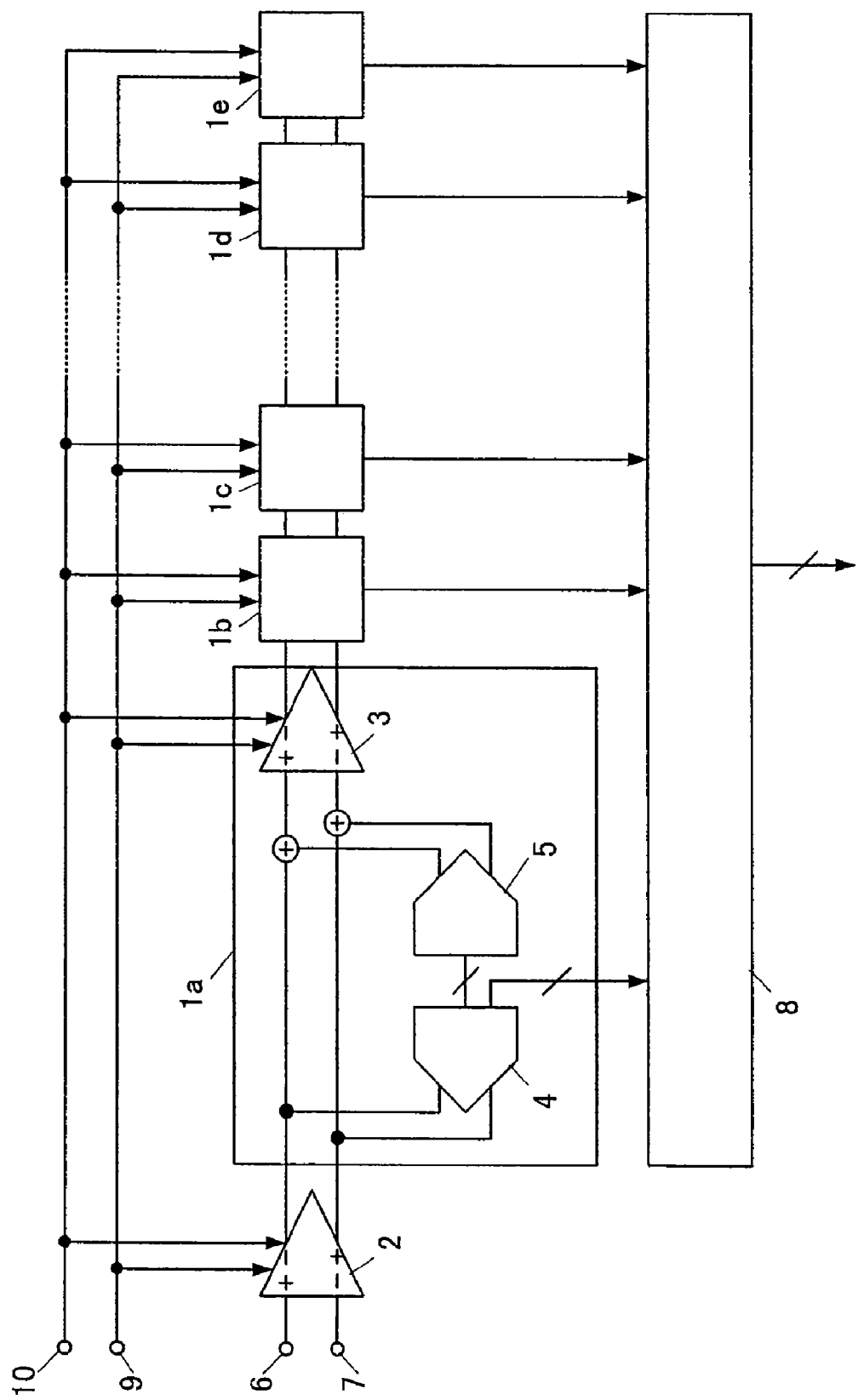
FIG. 5 is a view showing the configuration of a pipeline A/D converter in accordance with Embodiment 2.

A pipeline A/D converter in accordance with Embodiment 2 of the present invention will be described with reference to FIG. 5. FIG. 5 is a view showing the configuration of the pipeline A/D converter in accordance with Embodiment 2 of the present invention. The configuration shown in FIG. 5 is obtained by adding a control signal input terminal 10 to the configuration (FIG. 1) of Embodiment 1 described above. The working of the A/D converter and the operation of each of the operational amplifiers constituting the A/D converter are basically similar to those of Embodiment 1. The capacitances of the operational amplifiers 2 and 3 can be switched using a control signal input from the control signal input terminal 9. Furthermore, in the pipeline A/D converter in accordance with Embodiment 2, the current flowing in each of the differential amplifier circuits 11 (FIGS. 2 and 3) of the operational amplifiers 2 and 3 can be changed, and the conductance of the output stage thereof can be changed according to a control signal input from the outside to the control signal input terminal 10.

In Embodiment 1, in the case that the resolution of an A/D converter incorporated in an apparatus (for example, an electronic camera) is lowered, the capacitance value of each of the operational amplifiers 2 and 3 is switched to a small value according to the control signal from the control signal input terminal 9. In the case that the resolution of the A/D converter is raised, the capacitance value of each of the operational amplifiers 2 and 3 is switched to a large value.

In Embodiment 2, the control signal from the control signal input terminal 10 is used in combination with the control signal from the control signal input terminal 9. In the case that the resolution of an A/D converter incorporated in an apparatus (for example, an electronic camera) is lowered, the capacitance value of each of the operational amplifiers 2 and 3 is switched to a small value according to the control signal from the control signal input terminal 9. Furthermore, the current flowing in the differential amplifier is decreased to a value suited for the capacitance value according to the control signal from the control signal input terminal 10. Hence, the resolution of the A/D converter can be reduced, and the power consumption thereof can also be reduced.

In the case that the resolution is raised, the capacitance value of each of the operational amplifiers 2 and 3 is switched to a large value, and the current flowing in the differential amplifier is increased to a value suited for the capacitance value according to the control signal from the control signal input terminal 10. Hence, the resolution of the A/D converter can be raised, and the power consumption thereof can be increased by only the amount required for satisfying the resolution.

Embodiment 3

Figure 6:
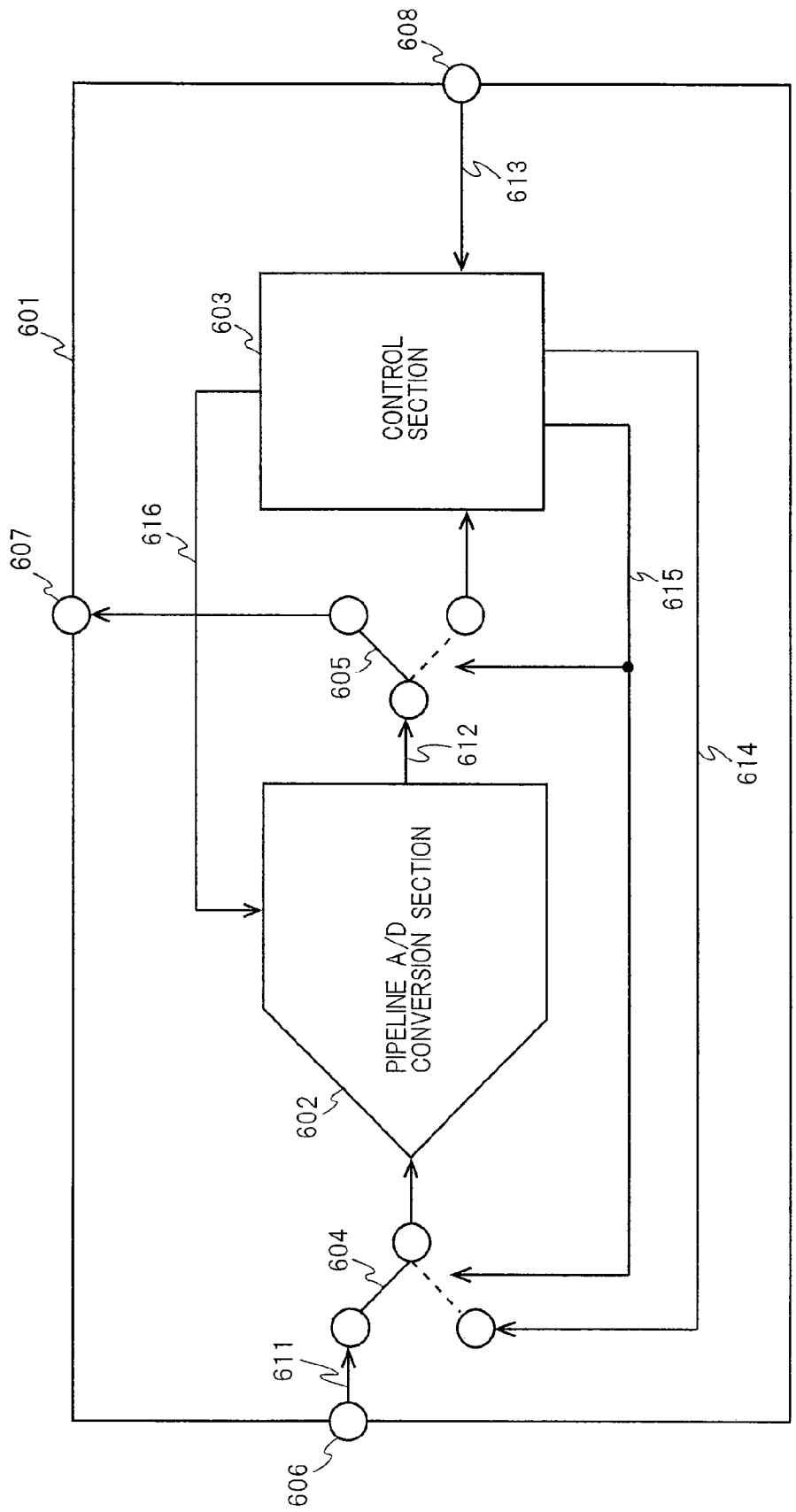
FIG. 6 is a view showing the configuration of a pipeline A/D converter in accordance with Embodiment 3.

A pipeline A/D converter in accordance with Embodiment 3 of the present invention will be described with reference to FIG. 6. The pipeline A/D converter 601 in accordance with Embodiment 3 is incorporated in an electronic camera. FIG. 6 is a view showing the configuration of the pipeline A/D converter 601 in accordance with Embodiment 3 of the present invention. In FIG. 6, the pipeline A/D converter 601 comprises a pipeline A/D conversion section 602, a control section 603, switches 604 and 605, an analog signal input terminal 606, a digital signal output terminal 607 and a state signal input terminal 608. The pipeline A/D converter 601 in accordance with Embodiment 3 of the present invention can be incorporated in any given electronic apparatus.

The control section 603 is an internal system operating independently of the operation of the pipeline A/D conversion section 602. The control section 603 outputs a control signal 616 to the control signal input terminal 9 (FIG. 1) of the pipeline A/D conversion section 602 and sets the capacitance value of each stage of the pipeline A/D conversion section 602. The control section 603 outputs a control signal 615 to the switches 604 and 605 and sets the connection states of the switches 604 and 605 as indicated by the solid lines or the broken lines shown in FIG. 6. The configuration of the pipeline A/D conversion section 602 is the same as that of the pipeline A/D converter in accordance with Embodiment 1.

During normal operation (referred to as a normal mode), the switches 604 and 605 are set at the states indicated by the solid lines. An analog video signal 611 is input to the pipeline A/D conversion section 602 via the analog signal input terminal 606 and the switch 604 and then A/D converted, and a digital video signal 612 is output via the switch 605 and the digital signal output terminal 607.

A system control section (not shown) for controlling the whole of the electronic camera outputs the state signal 613 of a portable phone to the pipeline A/D converter 601. The state signal 613 is input to the control section 603 via the state signal input terminal 608, and the control section 603 detects the timing in which the electronic camera does not require the operation of the A/D converter 601. The control section 603 carries out the following testing and setting processing at the timing in which the electronic camera does not require the operation of the A/D converter 601. The state in which the following processing is carried out is referred to as a test mode.

The control section 603 outputs the control signal 615 to the switches 604 and 605 and sets the connection states of the switches 604 and 605 as indicated by the broken lines. Furthermore, the control section 603 outputs the control signal 616 to the control signal input terminal 9 (FIG. 1) of the pipeline A/D conversion section 602 and sets the capacitance value of each stage of the pipeline A/D conversion section 602 at a small value (low resolution state). The control section 603 incorporates a test signal generator and a D/A converter having high resolution (16-bit accuracy, for example). The control section 603 outputs an analog test signal 614 (a ramp signal in Embodiment 3) having 16-bit accuracy.

The analog test signal 614 is input to the pipeline A/D conversion section 602 via the switch 604, and the digital video signal 612 is output. The digital output signal 612 is then input to the control section 603 via the switch 605. The control section 603 judges whether the value of the digital output signal 612 is proper or not. In the case that the value of the digital output signal 612 is proper, the control section 603 maintains the capacitance value of each stage of the pipeline A/D conversion section 602 at a small value (low resolution state). In the case that the value of the digital output signal 612 is improper, the control section 603 sets the capacitance value of each stage of the pipeline A/D conversion section 602 at a large value (high resolution state).

The control section 603 then terminates the test mode and returns the switches 604 and 605 to the states indicated by the solid lines.

The control section 603 may set the capacitance value of each stage of the pipeline A/D conversion section 602 at an appropriate value according to the state signal 613 regardless of the result of the judgment in the test mode. The resolution of the A/D converter is switched, and the conversion processing rate thereof is also changed. This makes it possible to carry out switching between the processing of the video signal at high resolution and low conversion processing rate and the processing of the video signal at low resolution and high conversion processing rate in the whole of the electronic camera.

In the A/D converter 601 in accordance with Embodiment 3, the state signal 613 is input to the control section 603 via the state signal input terminal 608. Instead of this, it may be possible that the state signal input terminal 608 is eliminated and that the control section 603 carries out the above-mentioned testing and setting processing at the power on time (the electronic camera is not used to take images).

Embodiment 4

Figure 7:
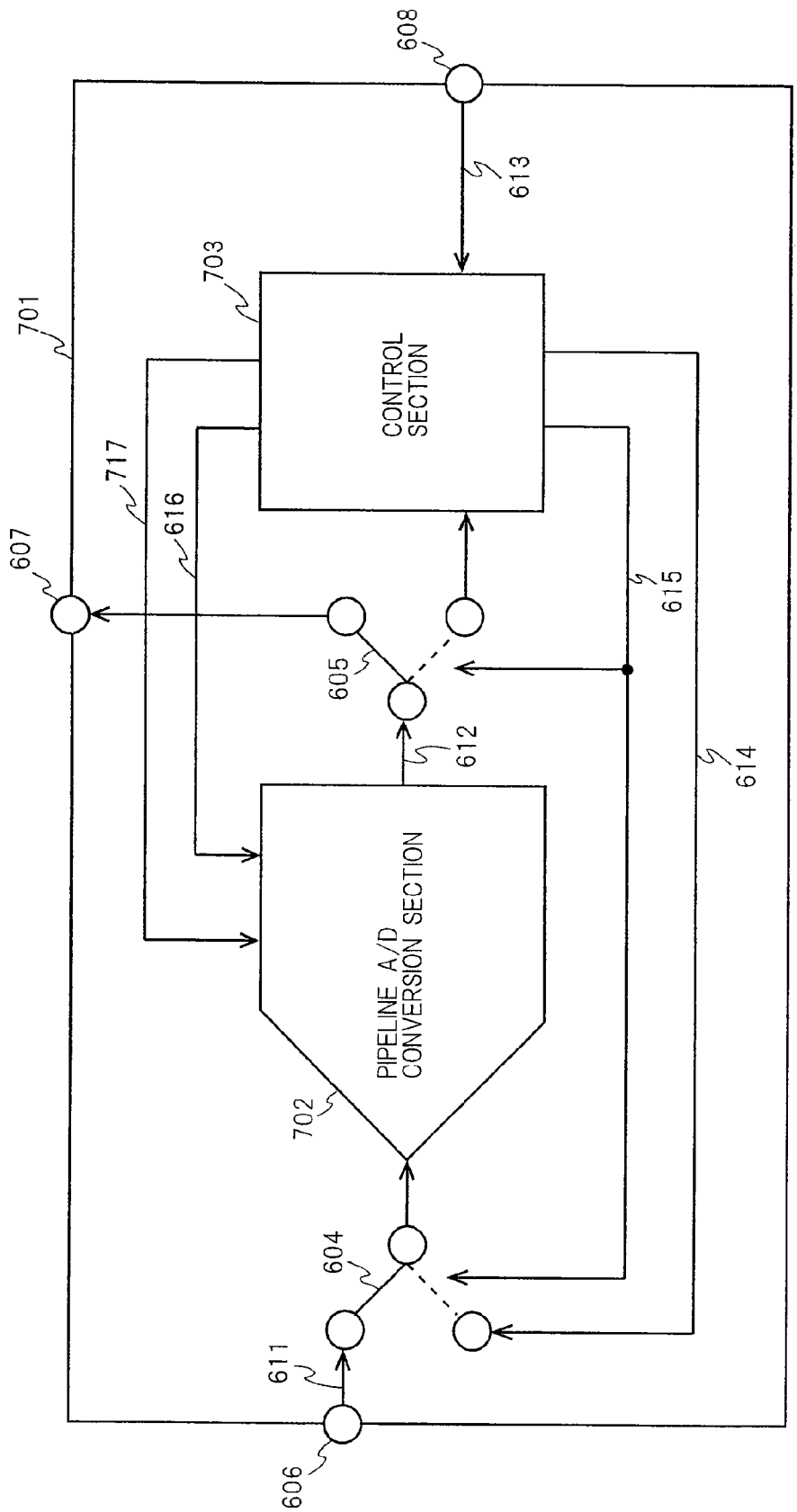
FIG. 7 is a view showing the configuration of a pipeline A/D converter in accordance with Embodiment 4.

A pipeline A/D converter in accordance with Embodiment 4 of the present invention will be described with reference to FIG. 7. The pipeline A/D converter 701 in accordance with Embodiment 4 is incorporated in an electronic camera. FIG. 7 is a view showing the configuration of the pipeline A/D converter 701 in accordance with Embodiment 4 of the present invention. In FIG. 7, the pipeline A/D converter 701 comprises a pipeline A/D conversion section 702, a control section 703, switches 604 and 605, an analog signal input terminal 606, a digital signal output terminal 607 and a state signal input terminal 608. The pipeline A/D converter 701 in accordance with Embodiment 4 of the present invention can be incorporated in any given electronic apparatus.

The control section 703 is an internal system operating independently of the operation of the pipeline A/D conversion section 702. The control section 703 outputs a control signal 616 to the control signal input terminal 9 (FIG. 5) of the pipeline A/D conversion section 702 and sets the capacitance value of each stage of the pipeline A/D conversion section 702. The control section 703 outputs a control signal 717 to the control signal input terminal 10 (FIG. 5) of the pipeline A/D conversion section 702 and sets the conductance of the output stage of the differential amplifier of each of the operational amplifiers 2 and 3 of the pipeline A/D conversion section 702. The control section 703 outputs a control signal 615 to the switches 604 and 605 and sets the connection states of the switches 604 and 605 as indicated by the solid lines or the broken lines shown in FIG. 7. The configuration of the pipeline A/D conversion section 702 is the same as that of the pipeline A/D converter in accordance with Embodiment 2. In FIG. 7, the same blocks and signals as those shown in FIG. 6 are designated by the same numerals.

During normal operation (referred to as a normal mode), the switches 604 and 605 are set at the states indicated by the solid lines. An analog video signal 611 is input to the pipeline A/D conversion section 702 via the analog signal input terminal 606 and the switch 604 and then A/D converted, and a digital video signal 612 is output via the switch 605 and the digital signal output terminal 607.

A system control section (not shown) for controlling the whole of the electronic camera outputs the state signal 613 of a portable phone to the pipeline A/D converter 701. The state signal 613 is input to the control section 703 via the state signal input terminal 608, and the control section 703 detects the timing in which the electronic camera does not require the operation of the A/D converter 701. The control section 703 carries out the following testing and setting processing at the timing in which the electronic camera does not require the operation of the A/D converter 701. The state in which the following processing is carried out is referred to as a test mode.

The control section 703 outputs the control signal 615 to the switches 604 and 605 and sets the connection states of the switches 604 and 605 as indicated by the broken lines. Furthermore, the control section 703 outputs the control signal 616 to the control signal input terminal 9 (FIG. 5) of the pipeline A/D conversion section 702 and sets the capacitance value of each stage of the pipeline A/D conversion section 702 at a small value (low resolution state). The control section 703 outputs the control signal 717 to the control signal input terminal 10 (FIG. 5) of the pipeline A/D conversion section 702 and sets the conductance of the output stage of each differential amplifier of the pipeline A/D conversion section 702 at a small value. The current flowing in the differential amplifier is small. The control section 703 incorporates a test signal generator and a D/A converter having high resolution (16-bit accuracy, for example). The control section 703 outputs an analog test signal 614 (a ramp signal in Embodiment 4) having 16-bit accuracy.

The analog test signal 614 is input to the pipeline A/D conversion section 702 via the switch 604, and the digital output signal 612 is output. The digital output signal 612 is then input to the control section 703 via the switch 605. The control section 703 judges whether the value of the digital output signal 612 is proper or not. In the case that the value of the digital output signal 612 is proper, the control section 703 maintains the capacitance value of each stage of the pipeline A/D conversion section 702 at a small value (low resolution state). Hence, the resolution of the A/D converter can be reduced, and the power consumption thereof can also be reduced. In the case that the value of the digital output signal 612 is improper, the control section 703 sets the capacitance value of each stage of the pipeline A/D conversion section 702 at a large value (high resolution state) and sets the conductance of the output stage of each differential amplifier of the pipeline A/D conversion section 702 at a large value. The current flowing in the differential amplifier increases. This increase of the current can be limited only in the case that the power consumption of the A/D converter is required to be raised.

The control section 703 then terminates the test mode and returns the switches 604 and 605 to the states indicated by the solid lines.

The control section 703 may set the capacitance value of each stage and/or the conductance of the output stage of each differential amplifier of the pipeline A/D conversion section 702 at appropriate values according to the state signal 613 regardless of the result of the judgment in the test mode. The capacitance value of each stage and the conductance of the output stage of each differential amplifier of the pipeline A/D conversion section 702 may be set so as to be related to each other or may be set so as to be independent of each other. With this setting, it is possible to attain power consumption matching to the resolution required for the whole of the electronic camera, and low power consumption can be attained at the time of low resolution. The resolution of the pipeline A/D converter is switched, and the conversion processing rate thereof is also changed. This makes it possible to carry out switching between the processing of the video signal at high resolution and low conversion processing rate and the processing of the video signal at low resolution and high conversion processing rate in the whole of the electronic camera.

In the A/D converter 701 in accordance with Embodiment 4, the state signal 613 is input to the control section 703 via the state signal input terminal 608. Instead of this, it may be possible that the state signal input terminal 608 is eliminated and that the control section 703 carries out the above-mentioned testing and setting processing at the power on time (the electronic camera is not used to take images).

Embodiment 5

Figure 8:
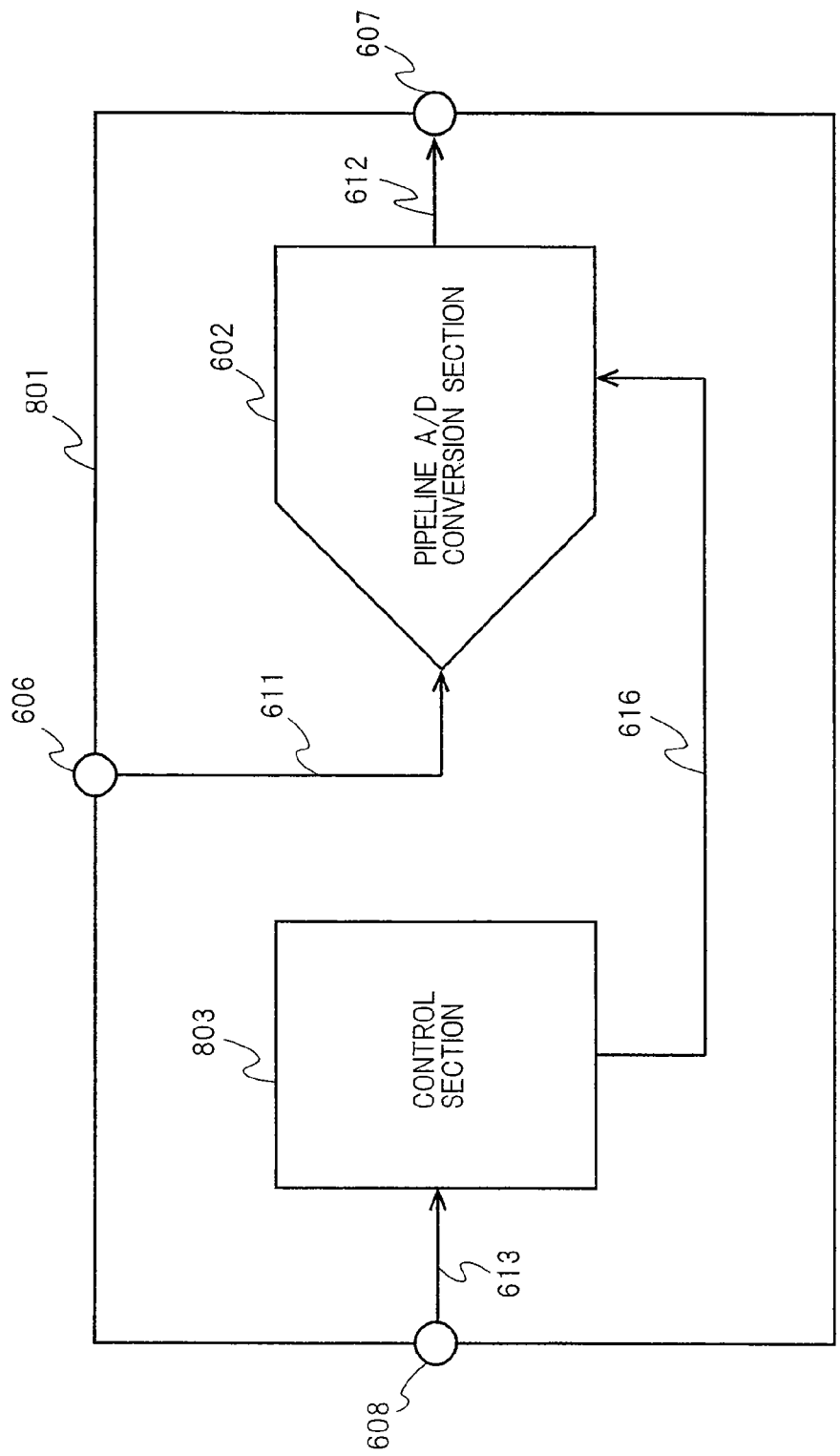
FIG. 8 is a view showing the configuration of a pipeline A/D converter in accordance with Embodiment 5.

A pipeline A/D converter in accordance with Embodiment 5 of the present invention will be described with reference to FIG. 8. The pipeline A/D converter 801 in accordance with Embodiment 5 is incorporated in an electronic camera. FIG. 8 is a view showing the configuration of the pipeline A/D converter 801 in accordance with Embodiment 5 of the present invention. In FIG. 8, the pipeline A/D converter 801 comprises a pipeline A/D conversion section 602, a control section 803, an analog signal input terminal 606, a digital signal output terminal 607 and a state signal input terminal 608. The pipeline A/D converter 801 in accordance with Embodiment 5 of the present invention can be incorporated in any given electronic apparatus.

The control section 803 is an internal system operating independently of the operation of the pipeline A/D conversion section 602. The control section 803 outputs a control signal 616 to the control signal input terminal 9 (FIG. 1) of the pipeline A/D conversion section 602 and sets the capacitance value of each stage of the pipeline A/D conversion section 602 according to a state signal 613. The configuration of the pipeline A/D conversion section 602 is the same as that of the pipeline A/D converter in accordance with Embodiment 1. In FIG. 8, the same blocks and signals as those shown in FIG. 6 (Embodiment 3) are designated by the same numerals.

A system control section (not shown) for controlling the whole of the electronic camera outputs the state signal 613 of a portable phone to the pipeline A/D converter 801. The state signal 613 is input to the control section 803 via the state signal input terminal 608. The control section 803 outputs the control signal 616 according to the state signal 613 and sets the capacitance value of each stage of the pipeline A/D conversion section 602 at an appropriate value.

More specifically, when the state signal 613 indicating that the electronic camera is in its recording state is input, the control section 803 outputs the control signal 616 and sets the capacitance value of each stage of the pipeline A/D conversion section 602 at a large value. The pipeline A/D conversion section 602 is set so as to have high resolution (14-bit accuracy). When the state signal 613 indicating that the electronic camera is in its reproduction state is input, the control section 803 outputs the control signal 616 and sets the capacitance value of each stage of the pipeline A/D conversion section 602 at a small value. The pipeline A/D conversion section 602 is set so as to have low resolution (12-bit accuracy), and the power consumption is reduced.

As described above, the resolution of the pipeline A/D converter 801 is switched according to the state signal, and the conversion processing rate thereof is also changed. This makes it possible to carry out switching between the processing of the video signal at high resolution and low conversion processing rate and the processing of the video signal at low resolution and high conversion processing rate in the whole of the electronic camera.

Embodiment 6

Figure 9:
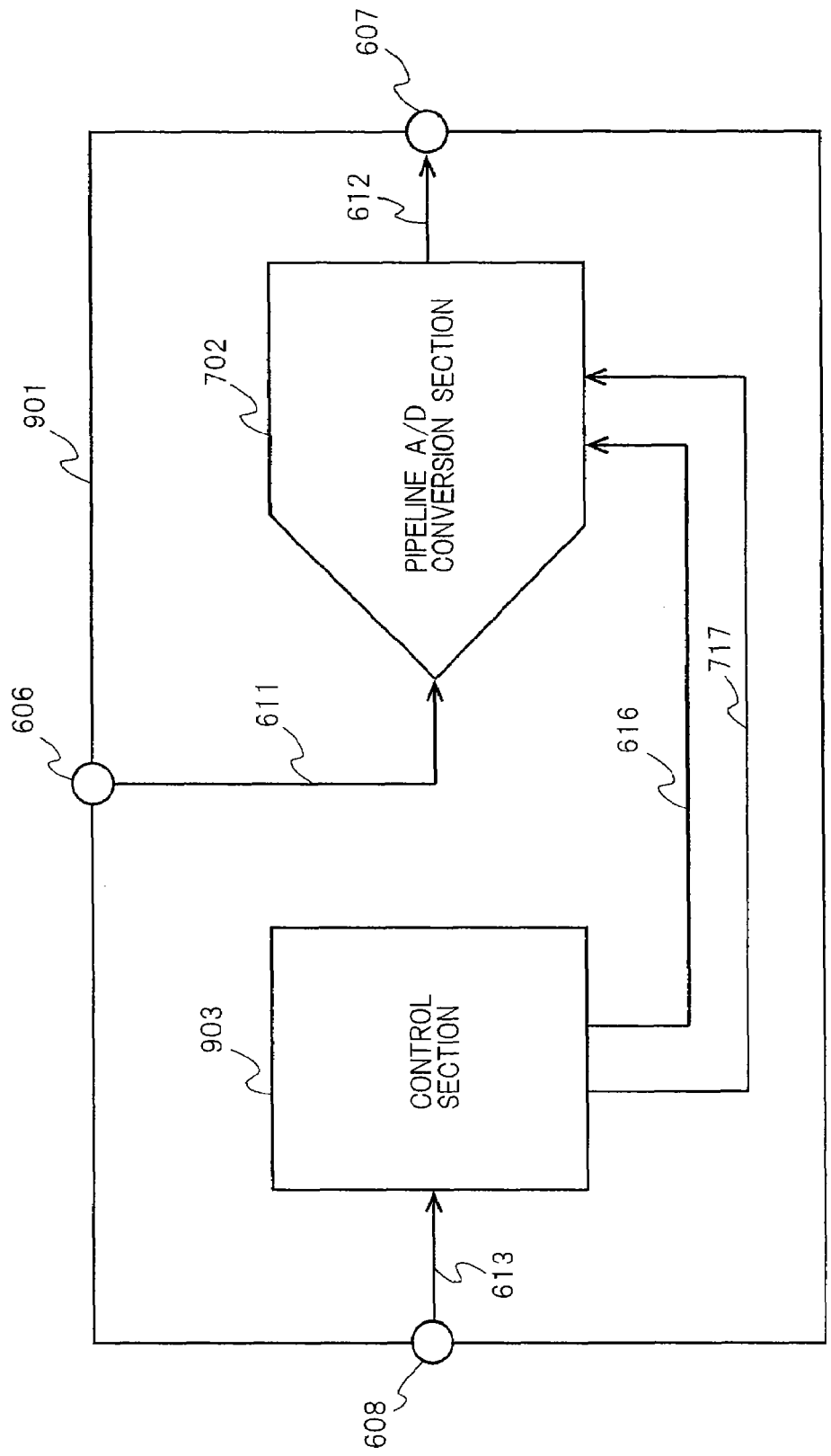
FIG. 9 is a view showing the configuration of a pipeline A/D converter in accordance with Embodiment 6.

A pipeline A/D converter in accordance with Embodiment 6 of the present invention will be described with reference to FIG. 9. The pipeline A/D converter 901 in accordance with Embodiment 6 is incorporated in an electronic camera. FIG. 9 is a view showing the configuration of the pipeline A/D converter 901 in accordance with Embodiment 6 of the present invention. In FIG. 9, the pipeline A/D converter 901 comprises a pipeline A/D conversion section 702, a control section 903, an analog signal input terminal 606, a digital signal output terminal 607 and a state signal input terminal 608. The pipeline A/D converter 901 in accordance with Embodiment 6 of the present invention can be incorporated in any given electronic apparatus.

The control section 903 is an internal system operating independently of the operation of the pipeline A/D conversion section 702. The control section 903 outputs a control signal 616 to the control signal input terminal 9 (FIG. 5) of the pipeline A/D conversion section 702 and sets the capacitance value of each stage of the pipeline A/D conversion section 702 according to a state signal 613. The control section 903 outputs a control signal 717 to the control signal input terminal 10 (FIG. 5) of the pipeline A/D conversion section 702 and sets the conductance of the output stage of the differential amplifier of each of the operational amplifiers 2 and 3 of the pipeline A/D conversion section 702. The configuration of the pipeline A/D conversion section 702 is the same as that of the pipeline A/D converter in accordance with Embodiment 2. In FIG. 9, the same blocks and signals as those shown in FIG. 7 (Embodiment 4) are designated by the same numerals.

A system control section (not shown) for controlling the whole of the electronic camera outputs the state signal 613 of a portable phone to the pipeline A/D converter 901. The state signal 613 is input to the control section 903 via the state signal input terminal 608. The control section 903 outputs the control signals 616 and 717 according to the state signal 613 and sets the capacitance value of each stage and the conductance of the output stage of each differential amplifier of the pipeline A/D conversion section 702 at appropriate values.

More specifically, when the state signal 613 indicating that the electronic camera is in its recording state is input, the control section 903 outputs the control signal 616 and sets the capacitance value of each stage of the pipeline A/D conversion section 702 at a large value. The control section 903 then outputs the control signal 717 and sets the conductance of the output stage of each differential amplifier of the pipeline A/D conversion section 702 at a large value. The pipeline A/D conversion section 702 is set so as to have high resolution (14-bit accuracy). When the state signal 613 indicating that the electronic camera is in its reproduction state is input, the control section 903 outputs the control signal 616 and sets the capacitance value of each stage of the pipeline A/D conversion section 702 at a small value. The control section 903 then outputs the control signal 717 and sets the conductance of the output stage of each differential amplifier of the pipeline A/D conversion section 702 at a small value. The pipeline A/D conversion section 702 is set so as to have low resolution (12-bit accuracy), and the power consumption is reduced.

As described above, the resolution of the pipeline A/D converter 901 is switched according to the state signal, and the conversion processing rate thereof is also changed. The capacitance value of each stage and the conductance of the output stage of each differential amplifier of the pipeline A/D conversion section 702 may be set so as to be related to each other or may be set so as to be independent of each other. With this setting, it is possible to attain power consumption matching to the resolution required for the whole of the electronic camera, and low power consumption can be attained at the time of low resolution. The resolution of the pipeline A/D converter is switched, and the conversion processing rate thereof is also changed. This makes it possible to carry out switching between the processing of the video signal at high resolution and low conversion processing rate and the processing of the video signal at low resolution and high conversion processing rate in the whole of the electronic camera.

Embodiment 7

Figure 10:
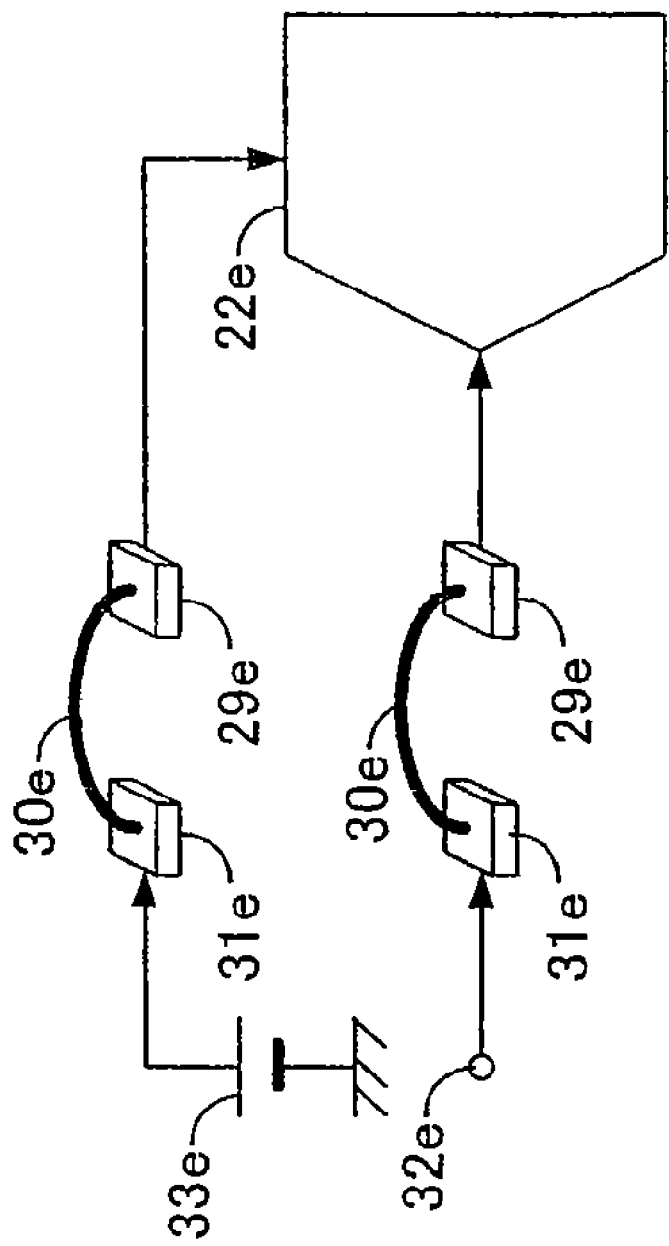
FIG. 10 is a view showing the configuration of a pipeline A/D converter in accordance with Embodiment 7.

A pipeline A/D converter in accordance with Embodiment 7 of the present invention will be described with reference to FIG. 10. The pipeline A/D converter in accordance with Embodiment 7 is an IC. FIG. 10 is a view showing the configuration of the pipeline A/D converter in accordance with Embodiment 7 of the present invention. In FIG. 10, numeral 22e designates a semiconductor chip constituting the circuit of the pipeline A/D converter in accordance with Embodiment 1. Numeral 29e designates an internal wiring pad for connecting each terminal of the semiconductor chip 22e to an external connection terminal using wires. Numeral 30e designates a wire, numeral 31e designates an external wiring pad, numeral 32e designates an analog input signal to be input from the outside, and numeral 33e designates a bias voltage source. The external wiring pad 31e is connected to the internal wiring pad 29e using the wire 30e.

In the production process of the pipeline A/D converter, an external tester (not shown) outputs the predetermined analog input signal 32e serving as a test signal. The analog input signal 32e is input to the semiconductor chip 22e (pipeline A/D converter) via the external wiring pad 31e, the wire 30e and the internal wiring pad 29e. A digital output signal (not shown) to be output from the semiconductor chip 22e is input to the external tester.

The external tester inputs the bias voltage 33e serving as a control voltage from the outside to the control signal input terminal 9 (FIG. 1) of the semiconductor chip 22e via the external wiring pad 31e, the wire 30e and the internal wiring pad 29e. Hence, the external tester sets the capacitance in each operational amplifier of the semiconductor chip 22e. In Embodiment 7, if the bias voltage 33e is ground potential, the capacitance in each operational amplifier of the semiconductor chip 22e is set at a small value. If the bias voltage 33e is the potential of the power source, the capacitance in each operational amplifier of the semiconductor chip 22e is set at a large value. The external tester carries out the same testing as that described in the test mode in accordance with Embodiment 3. The external tester judges whether the digital output signal is proper or not.

If the value of the digital output signal is proper in the state wherein the capacitance in each operational amplifier of the semiconductor chip 22e is set at a small value, a wire bonder (not shown) in the production process connects the internal wiring pad 29e, which is connected to the control signal input terminal 9 (FIG. 1) of the semiconductor chip 22e serving as the pipeline A/D converter, to an external wiring pad (not shown) having ground potential. If the value of the digital output signal is improper in the state wherein the capacitance in each operational amplifier of the semiconductor chip 22e is set at a small value and if the value of the digital output signal is proper in the state wherein the capacitance in each operational amplifier is set at a large value, the wire bonder (not shown) in the production process connects the internal wiring pad 29e, which is connected to the control signal input terminal 9 (FIG. 1) of the semiconductor chip 22e, to an external wiring pad (not shown) having the potential of the power source.

In the case that the resolution and allowable conversion frequency required for the pipeline A/D converter have been determined in the production process, the characteristics of the pipeline A/D converter can be fixed by internally connecting the control signal input terminal 9 (FIG. 1) to a certain bias voltage using the wire 30e as described in this embodiment. Multiple pipeline A/D converters being different in resolution and allowable conversion frequency can thus be realized by using one type of IC chip.

Embodiment 8

Figure 11:
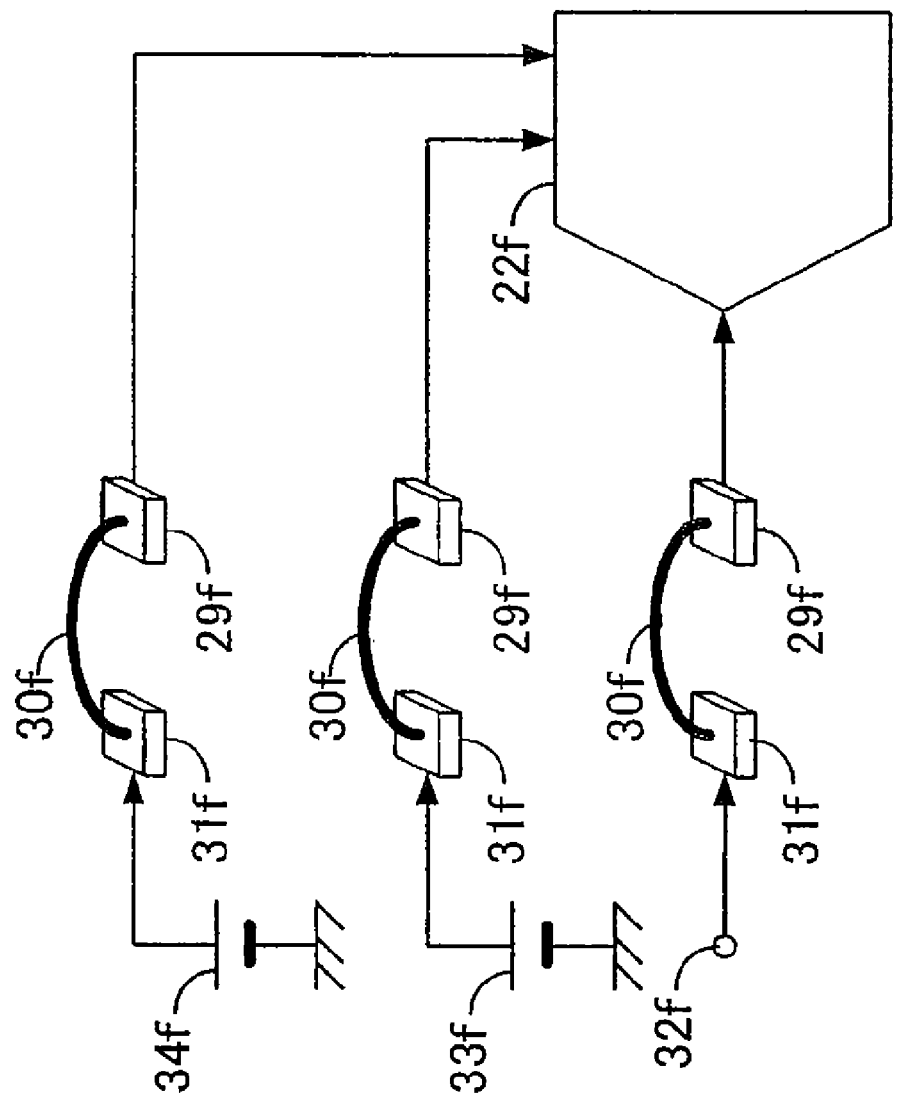
FIG. 11 is a view showing the configuration of a pipeline A/D converter in accordance with Embodiment 8.
Figure 12:
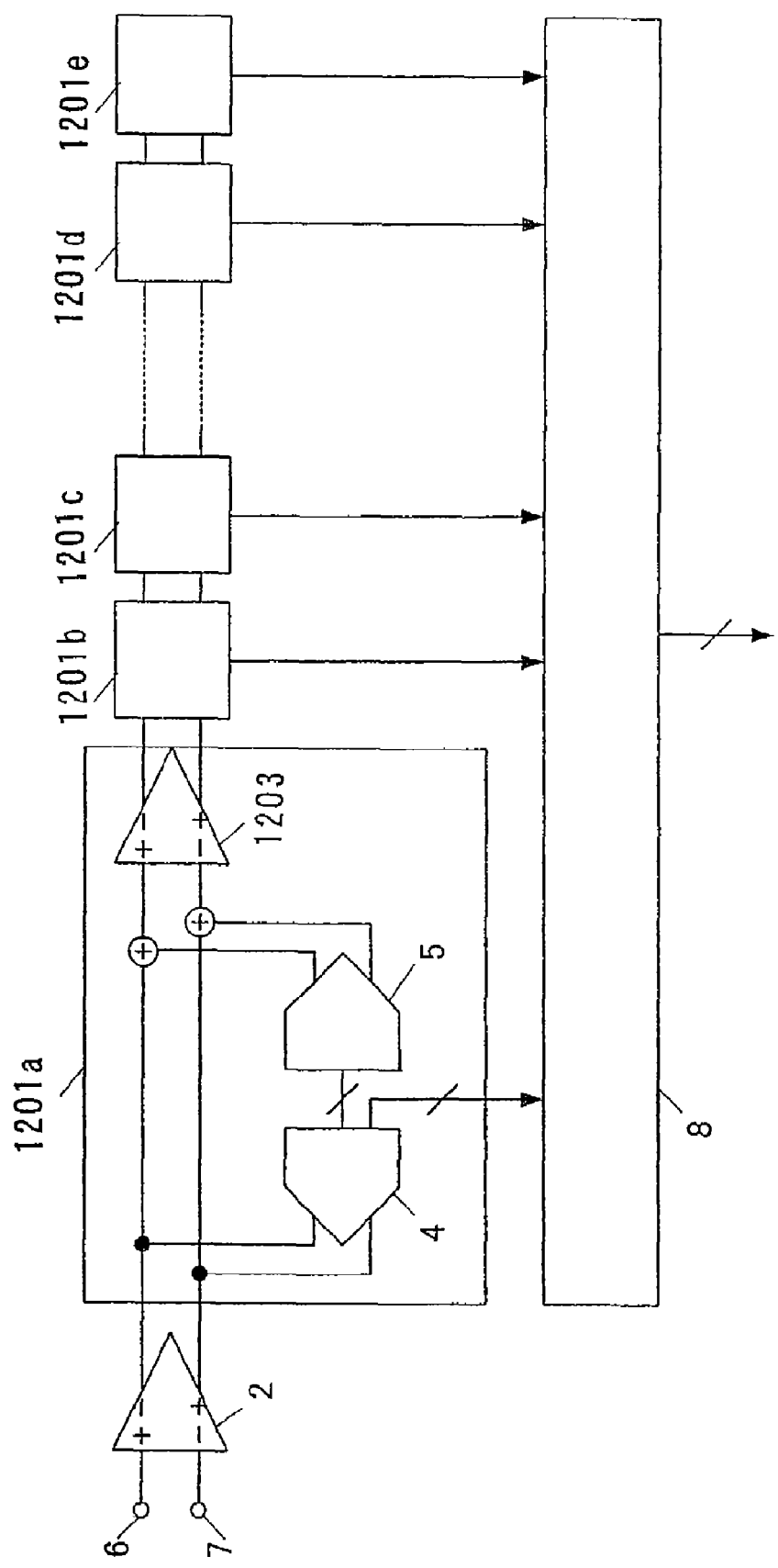
FIG. 12 is a view showing the configuration of the pipeline A/D converter in accordance with the conventional example.
Figure 13:
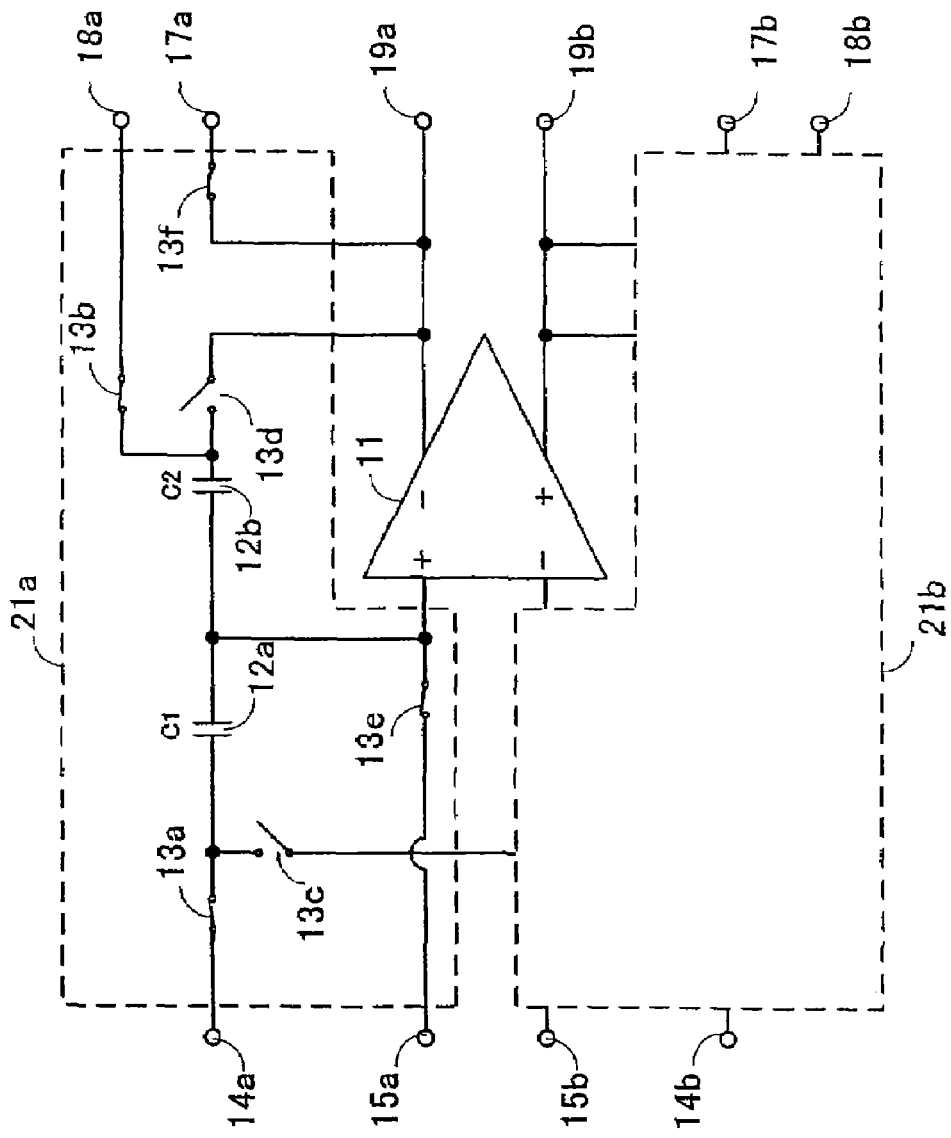
FIG. 13 is a view showing a configuration of the operational amplifier constituting the pipeline A/D converter in accordance with the conventional example.
Figure 14:
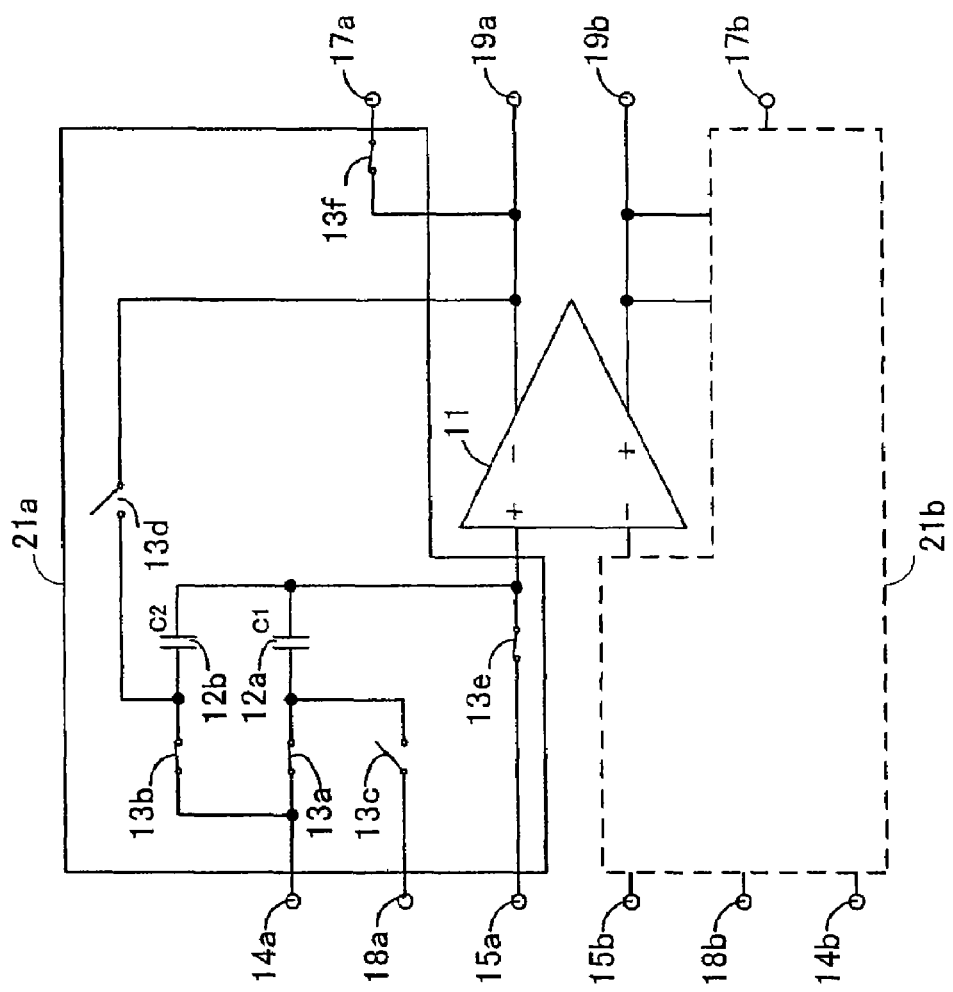
FIG. 14 is a view showing a configuration of the operational amplifier constituting the pipeline A/D converter in accordance with another conventional example.

A pipeline A/D converter in accordance with Embodiment 8 of the present invention will be described with reference to FIG. 11. The pipeline A/D converter in accordance with Embodiment 8 is an IC. FIG. 11 is a view showing the configuration of the pipeline A/D converter in accordance with Embodiment 8 of the present invention. In FIG. 11, numeral 22f designates a semiconductor chip constituting the circuit of the pipeline A/D converter in accordance with Embodiment 2. Numeral 29f designates an internal wiring pad for connecting each terminal of the semiconductor chip 22f to an external connection terminal using wires. Numeral 30f designates a wire, numeral 31f designates an external wiring pad, numeral 32f designates an analog input signal to be input from the outside, and numerals 33f and 34f designate bias voltage sources. The external wiring pad 31f is connected to the internal wiring pad 29f using the wire 30f.

In the production process of the pipeline A/D converter, an external tester (not shown) outputs the predetermined analog input signal 32f serving as a test signal. The analog input signal 32f is input to the semiconductor chip 22f (pipeline A/D converter) via the external wiring pad 31f, the wire 30f and the internal wiring pad 29f. A digital output signal (not shown) to be output from the semiconductor chip 22f is input to the external tester.

The external tester inputs the bias voltages 33f and 34f serving as control voltages from the outside to the control signal input terminals 9 and 10 (FIG. 5) of the semiconductor chip 22f via the external wiring pad 31f, the wire 30f and the internal wiring pad 29f. Hence, the external tester sets the capacitance in each operational amplifier and the conductance of the output stage of each differential amplifier of the semiconductor chip 22f. In Embodiment 8, if the bias voltage 33f is ground potential, the capacitance in each operational amplifier of the semiconductor chip 22f is set at a small value. If the bias voltage 33f is the potential of the power source, the capacitance in each operational amplifier of the semiconductor chip 22f is set at a large value.

In Embodiment 8, if the bias voltage 34f is ground potential, the conductance of the output stage of each differential amplifier of the semiconductor chip 22f is set at a small value. If the bias voltage 34f is the potential of the power source, the conductance of the output stage of each differential amplifier of the semiconductor chip 22f is set at a large value. The external tester carries out the same testing as that described in the test mode in accordance with Embodiment 4. The external tester judges whether the digital output signal is proper or not.

If the value of the digital output signal is proper in the state wherein the capacitance in each operational amplifier of the semiconductor chip 22f is set at a small value, a wire bonder (not shown) in the production process connects the internal wiring pads 29f, which are connected to the control signal input terminals 9 and 10 (FIG. 5) of the semiconductor chip 22f serving as the pipeline A/D converter, to external wiring pads (not shown) having ground potential. The current flowing in the differential amplifier in each operational amplifier is small. If the value of the digital output signal is improper in the state wherein the capacitance in each operational amplifier of the semiconductor chip 22f is set at a small value and if the value of the digital output signal is proper in the state wherein the capacitance in each operational amplifier is set at a large value, the wire bonder (not shown) in the production process connects the internal wiring pads 29f, which are connected to the control signal input terminals 9 and 10 (FIG. 5) of the semiconductor chip 22f, to external wiring pads (not shown) having the potential of the power sources. The current flowing in the differential amplifier in each operational amplifier becomes large.

In the case that the resolution, allowable conversion frequency and power consumption required for the pipeline A/D converter have been determined in the production process, the characteristics of the pipeline A/D converter can be fixed by internally connecting the control signal input terminals 9 and 10 (FIG. 5) to certain bias voltages using the wires 30f as described in this embodiment. The capacitance value of each stage and the conductance of the output stage of each differential amplifier of the pipeline A/D converter may be set so as to be related to each other or may be set so as to be independent of each other. Multiple pipeline A/D converters being different in resolution and allowable conversion frequency can thus be realized by using one type of IC chip.

The pipeline A/D converter in accordance with the present invention is therefore useful.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A pipeline A/D converter having a first mode and a second mode and comprising multiple stages connected by pipelines, at least one of said stages comprising:
an amplifier,
a first pair of a first capacitor and a second capacitor, and
a second pair of a third capacitor and a fourth capacitor, wherein
in said first mode, said amplifier amplifies an analog input signal at the amplification factor corresponding to the capacitance of said first pair of capacitors and outputs an amplified signal, and in said second mode, said amplifier amplifies said analog input signal at the amplification factor corresponding to the capacitance of only said second pair of capacitors or the capacitance of said first and second pairs of capacitors and outputs an amplified signal, and wherein at least one of said stages comprises:
an amplifier;
a first pair of a first capacitor and a second capacitor connected in series, at least said first capacitor being charged with the charge corresponding to said analog input signal in a first period, the charges stored in said first capacitor and said second capacitor being redistributed in a second period while current flowing is prevented at the connection point of said first capacitor and said second capacitor, the connection point of said first capacitor and said second capacitor being connected to the input terminal of said amplifier, and one terminal of said second capacitor, not connected to said first capacitor, being connected to the output terminal of said amplifier; and
a second pair of a third capacitor and a fourth capacitor connected in series, at least said third capacitor being charged with the charge corresponding to said analog input signal in said first period, the charges stored in said third capacitor and said fourth capacitor being redistributed in said second period while current flowing is prevented at the connection point of said third capacitor and said fourth capacitor, the connection point of said third capacitor and said fourth capacitor being connected to an input terminal of said amplifier, and one terminal of said fourth capacitor, not connected to said third capacitor, being connected to an output terminal of said amplifier.

2. A The pipeline A/D converter in accordance with claim 1, wherein said stage further comprises:
a first switch, one terminal of which receives said analog input signal and the other terminal of which is connected to one terminal of said first capacitor, not connected to said second capacitor, and said switch being turned ON in said first period and turned OFF in said second period;
a second switch, one terminal of which is connected to the connection point of said first switch and said first capacitor, said switch being turned OFF in said first period and turned ON in said second period, and at least the potential at the other terminal of said first capacitor being input to said amplifier;
a third switch, one terminal of which receives a DC bias voltage and the other terminal of which is connected to the connection point of said first capacitor and said second capacitor, and said switch being turned ON in said first period and turned OFF in said second period;
a fourth switch, one terminal of which receives said analog input signal or said DC bias voltage and the other terminal of which is connected to one terminal of said second capacitor, not connected to said first capacitor, and said switch being turned ON in said first period and turned OFF in said second period;
a fifth switch, one terminal of which is connected to the connection point of said second capacitor and said fourth switch and the other terminal of which is connected to the output terminal of said amplifier, and said switch being turned OFF in said first period and turned ON in said second period;
a sixth switch, one terminal of which receives said analog input signal and the other terminal of which is connected to one terminal of said third capacitor, not connected to said fourth capacitor, and said switch being turned ON in said first period and turned OFF in said second period;
a seventh switch, one terminal of which is connected to the connection point of said sixth switch and said third capacitor, said switch being turned OFF in said first period and turned ON in said second period, and at least the potential at the other terminal of said third capacitor being input to said amplifier;
an eighth switch, one terminal of which receives said DC bias voltage and the other terminal of which is connected to the connection point of said third capacitor and said fourth capacitor, and said switch being turned ON in said first period and turned OFF in said second period;
a ninth switch, one terminal of which receives said analog input signal or said DC bias voltage and the other terminal of which is connected to one terminal of said fourth capacitor, not connected to said third capacitor, and said switch being turned ON in said first period and turned OFF in said second period; and
a tenth switch, one terminal of which is connected to the connection point of said fourth capacitor and said ninth switch and the other terminal of which is connected to the output terminal of said amplifier, and said switch being turned OFF in said first period and turned ON in said second period.

3. The pipeline A/D converter in accordance with claim 1, wherein the conductance of an output stage of said amplifier is switched according to said mode.

4. The pipeline A/D converter in accordance with claim 1, wherein said mode is fixed using electrical wiring.

* * * * *